(12) United States Patent
Furuhashi et al.

(10) Patent No.: US 10,529,799 B2
(45) Date of Patent: Jan. 7, 2020

(54) SEMICONDUCTOR DEVICE

(71) Applicant: Mitsubishi Electric Corporation, Chiyoda-ku (JP)

(72) Inventors: Masayuki Furuhashi, Tokyo (JP); Kohei Ebihara, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/309,504

(22) PCT Filed: Jun. 2, 2017

(86) PCT No.: PCT/JP2017/020604
§ 371 (c)(1),
(2) Date: Dec. 13, 2018

(87) PCT Pub. No.: WO2018/029951
PCT Pub. Date: Feb. 15, 2018

(65) Prior Publication Data
US 2019/0333988 A1 Oct. 31, 2019

(30) Foreign Application Priority Data
Aug. 8, 2016 (JP) .................. 2016-155446

(51) Int. Cl.
*H01L 29/78* (2006.01)
*H01L 29/06* (2006.01)
(Continued)

(52) U.S. Cl.
CPC ...... *H01L 29/0634* (2013.01); *H01L 29/0865* (2013.01); *H01L 29/0882* (2013.01);
(Continued)

(58) Field of Classification Search
None
See application file for complete search history.

(56) References Cited

U.S. PATENT DOCUMENTS 6,844,592 B2 * 1/2005 Yamaguchi ....... H01L 29/66712
257/341
9,972,713 B2 * 5/2018 Eguchi ............. H01L 29/66477
(Continued)

FOREIGN PATENT DOCUMENTS

JP 2000-277726 A 10/2000
JP 2001-298190 A 10/2001
(Continued)

OTHER PUBLICATIONS

International Search Report dated Aug. 1, 2017 in PCT/JP2017/020604 filed on Jun. 2, 2017.

*Primary Examiner* — Benjamin P Sandvik
(74) *Attorney, Agent, or Firm* — Oblon, McClelland, Maier & Neustadt, L.L.P.

(57) ABSTRACT

A semiconductor device includes a semiconductor substrate, and a semiconductor layer disposed on the semiconductor substrate. First and second pillar layers, of respective first and second conductivity types, are alternately provided in a direction in parallel with a main surface in an active region of the semiconductor layer and in a termination region. A pillar pitch in the termination region is set to be larger than a pillar pitch in the active region. A product of a width of one of the first pillar layers and effective impurity concentration of the first conductivity of the one of the first pillar layers is equal to a product of a width of one of the second pillar layers and effective impurity concentration of the second conductivity of the one of the second pillar layers.

8 Claims, 19 Drawing Sheets

(51) Int. Cl.
    *H01L 29/417*     (2006.01)
    *H01L 29/16*     (2006.01)
    *H01L 29/08*     (2006.01)
    *H01L 21/04*     (2006.01)
    *H01L 29/36*     (2006.01)
    *H01L 29/10*     (2006.01)
    *H01L 21/02*     (2006.01)
    *H01L 29/49*     (2006.01)

(52) U.S. Cl.
CPC .... H01L 29/1608 (2013.01); H01L 29/41741 (2013.01); H01L 29/7811 (2013.01); *H01L 21/02164* (2013.01); *H01L 21/02271* (2013.01); *H01L 21/02378* (2013.01); *H01L 21/02529* (2013.01); *H01L 21/02634* (2013.01); *H01L 21/049* (2013.01); *H01L 21/0465* (2013.01); *H01L 21/0475* (2013.01); *H01L 21/0485* (2013.01); *H01L 29/0696* (2013.01); *H01L 29/1095* (2013.01); *H01L 29/36* (2013.01); *H01L 29/4916* (2013.01)

(56) References Cited

U.S. PATENT DOCUMENTS

| | | |
|---|---|---|
| 2003/0222327 A1 | 12/2003 | Yamaguchi et al. |
| 2005/0116313 A1* | 6/2005 | Lee .................... H01L 29/0634 257/500 |
| 2008/0017897 A1 | 1/2008 | Saito et al. |
| 2018/0166531 A1* | 6/2018 | Bolotnikov ......... H01L 29/0634 |

FOREIGN PATENT DOCUMENTS

| | | |
|---|---|---|
| JP | 2003-273355 A | 9/2003 |
| JP | 2006-186108 A | 7/2006 |
| JP | 2007-207784 A | 8/2007 |
| JP | 2008-227514 A | 9/2008 |
| WO | WO 2005/065385 A2 | 7/2005 |

* cited by examiner

F I G . 1
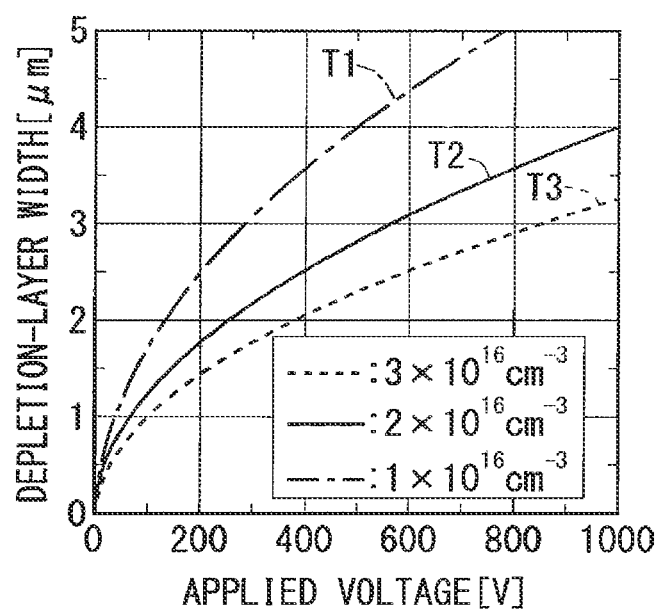
F I G . 2
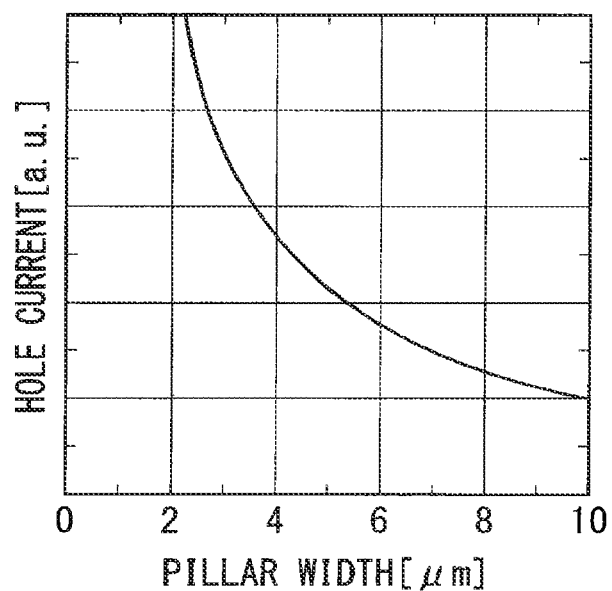

SEMICONDUCTOR DEVICE

TECHNICAL FIELD

The present invention relates to a semiconductor device, and more particularly to a semiconductor device having a super junction structure (SJ structure) in which p-type impurity layers and n-type impurity layers that extend in a direction perpendicular to a main surface of a semiconductor substrate are alternately disposed in a direction parallel with the main surface of the semiconductor substrate.

BACKGROUND ART

As a semiconductor device used in power electronics, a vertical device is primarily used. The vertical device includes a main electrode on each of two opposing main surfaces of a semiconductor substrate, and a main current flows in a direction perpendicular to the main surfaces of the semiconductor substrate. In a usual vertical metal oxide semiconductor field effect transistor (MOSFET), when the MOSFET is turned off, a depletion layer extends in a drift layer, and the depletion layer serves as a voltage blocking layer. When the device is turned on, a current flows through the drift layer provided on the semiconductor substrate. The drift layer, which has higher resistance than that of the semiconductor substrate, is one of major resistance components of the device. Therefore, a smaller thickness of the drift layer can reduce drift resistance, and can reduce substantial on-resistance of the MOSFET. Further, on-resistance can also be reduced by increasing impurity concentration in the drift layer.

The breakdown voltage of the semiconductor device is determined by the width of, the depletion layer in the drift layer. That is, a smaller, thickness of the drift layer reduces a breakdown voltage of the semiconductor device. Further, higher impurity concentration of the drift layer also reduces the width of the depletion layer, and thus reduces a breakdown voltage of the semiconductor device. In this manner, a trade-off relationship exists between a breakdown voltage and on-resistance.

As a structure for improving the trade-off relationship between a breakdown voltage and on-resistance, a super junction structure is proposed. The super junction structure is a structure in which, in the drift layer, p-type impurity layers (hereinafter referred to as p-type pillar layers) and n-type impurity layers (hereinafter referred to as n-type pillar layers) are alternately arrayed in a direction orthogonal to the direction in which the main current flows.

In such an SJ structure, when the drift layer has a conductivity type of an n type, a depletion layer extends from a pn junction surface between the p-type pillar layer and the n-type pillar layer, as well as from a pn junction surface or a metal junction surface present on a surface of the semiconductor device. That is, a depletion layer having the same depth as the depth of the pillar layer is formed in the drift layer. With this, even when impurity concentration of the n-type pillar layer, i.e., impurity concentration of the drift layer, is high concentration, the concentration is equal to impurity concentration of the p-type pillar layer, and the n-type pillar layer is thereby fully depleted. Thus, the breakdown voltage can be maintained. As a result, the trade-off relationship between a breakdown voltage and on-resistance in the semiconductor device is drastically improved, and drift resistance can be lowered.

A semiconductor device having the SJ structure has an important problem as to how to secure a breakdown voltage in a termination region that is a peripheral portion of an element region (active region). A low breakdown voltage at a termination part reduces a breakdown voltage of the entire semiconductor device. Further, concentration of an avalanche current at the termination part may cause malfunction of the semiconductor device.

In general, impurity concentration of the p-type pillar layer and the n-type pillar layer in the termination region is set to be lower than impurity concentration of the p-type pillar layer and the n-type pillar layer in the element region. This is because when the impurity concentration in the termination region, in particular, donor concentration in the n-type pillar layer, is reduced to be low, a breakdown voltage in the termination region is improved.

Patent Document 1 discloses a technology of a multi-epitaxial method in a silicon semiconductor device where epitaxial growth and ion implantation are repeated to form a large number of epitaxial growth layers in a drift layer, thus forming the SJ structure. Here, impurity concentration in a termination region is set to be lower than impurity concentration of an active region. Such a configuration, however, cannot be produced with an SJ structure that is formed with a highly productive trench filling method, and is not suited for a semiconductor such as silicon carbide that has a small diffusion coefficient of impurity.

PRIOR ART DOCUMENT

Patent Document

Patent Document 1: Japanese Patent Application Laid-Open No. 2001-298190

SUMMARY

Problem to be Solved by the Invention

Further, it is also effective to increase the width of the termination region to the extent possible for improvement in a breakdown voltage of the termination region. As the width of the termination region is larger, an electric field applied in the termination region is more lessened, and improvement in a breakdown voltage of the semiconductor device can be thus expected.

A larger width in the termination region, however, increases a hole current generated by depletion in the p-type pillar layer in the termination region when the semiconductor device is turned off. When the semiconductor device is manufactured by a silicon semiconductor or a silicon carbide semiconductor, hole mobility in semiconductor crystals is lower than electron mobility, and a resistance value to a hole current is increased, resulting in increasing electric potential on the periphery of a source contact in the termination region. Then, the high electric potential is applied to an insulating layer on a surface in the element region, thus causing malfunction in the semiconductor device. Further, if impurity concentration of the n-type pillar layer is increased with the intention of lowering drift resistance, impurity concentration of the p-type pillar layer needs to be correspondingly increased to be equal thereto. Also in this case, a hole current flowing due to turn-off is increased.

The present invention is made in order to solve the problems as described above, and has an object to provide a semiconductor device improved in a breakdown voltage in a termination region.

Means to Solve the Problem

According to the present invention, a semiconductor device includes: a semiconductor substrate; a semiconductor layer of a first conductivity type that is disposed on the semiconductor substrate; a first impurity region of a second conductivity type that is selectively disposed on an upper layer portion of the semiconductor layer in an active region; a second impurity region of the first conductivity type that is selectively disposed on an upper layer portion of the first impurity region; a first main electrode connected to the second impurity region; a gate insulating film disposed to be continuously in contact with the second impurity region, the first impurity region, and the semiconductor layer; a gate electrode disposed to be opposed to the second impurity region, the first impurity region, and the semiconductor layer across the gate insulating film; and a second main electrode disposed on an opposite side to the semiconductor layer of the semiconductor substrate. The semiconductor layer includes first pillar layers of the first conductivity type and second pillar layers of the second conductivity type. The first pillar layers and the second pillar layers are provided to extend from a main surface located on an opposite side to the semiconductor substrate toward the semiconductor substrate by a predetermined depth. The first pillar layers and the second pillar layers are alternately provided in a direction in parallel with the main surface in the active region of the semiconductor layer and in a termination region that is a region around the active region. The first impurity region is provided in an upper layer portion of the second pillar layers. The semiconductor layer to which the gate insulating film comes in contact is the first pillar layers. A pillar pitch defined by a total width of a pair of one of the first pillar layers and one of the second pillar layers in the termination region is set to be larger than a pillar pitch defined by a total width of a pair of one of the first pillar layers and one of the second pillar layers in the active region. A product of a width of one of the first pillar layers and effective impurity concentration of the first conductivity of the one of the first pillar layers is equal to a product of a width of one of the second pillar layers and effective impurity concentration of the second conductivity of the one of the second pillar layers in each of the active region and the termination region.

Effects of the Invention

According to the semiconductor device of the present invention, a semiconductor device lowered in electric potential generated in a termination region and improved in a breakdown voltage in the termination region can be obtained.

BRIEF DESCRIPTION OF DRAWINGS

FIG. 1 is a graph showing extension of a depletion layer against an applied voltage at a pn junction.

FIG. 2 is a graph showing change in a hole current against the width of a pillar layer.

DESCRIPTION OF EMBODIMENTS

Introduction

Figure 3:
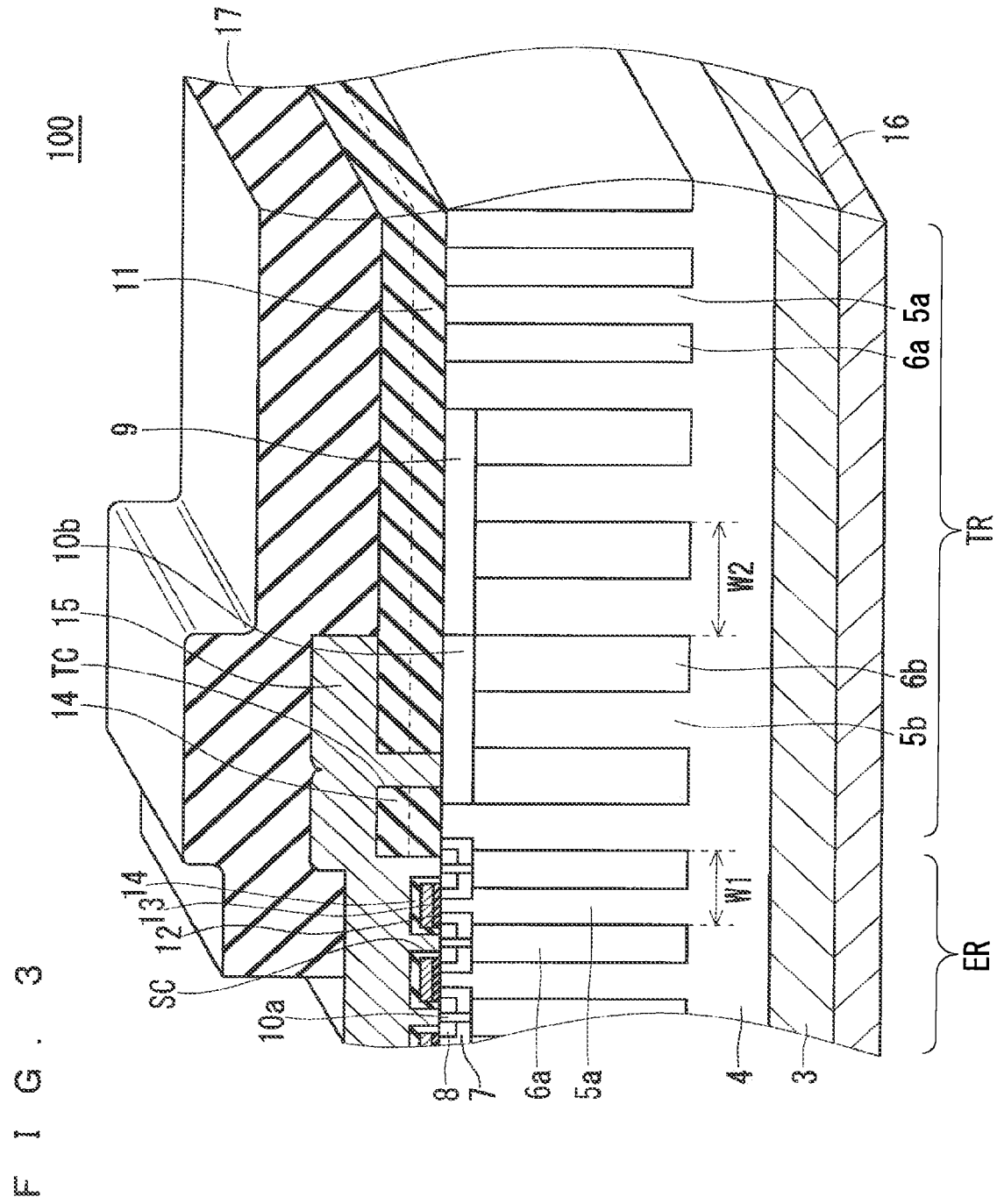
FIG. 3 is a perspective view illustrating a configuration of a semiconductor device according to a first embodiment of the present invention.

Prior to the description of embodiments, a super junction structure (SJ structure) is described.

In a usual MOSFET without a super junction structure, a guard ring, a junction termination extension (JTE) structure, a field limiting ring (FLR) structure, or the like is formed in a termination region. Similarly to an element region where a depletion layer extends from a junction surface between a base region and a drift layer toward the drift layer, in a termination structure, a depletion layer extends from a junction surface between a drift layer and a termination structure toward the drift layer. In this case, the number of holes emitted from the termination structure is equal to the number of electrons present in the depleted region extending in the drift layer. Further, due to increase in a drain voltage, the depletion layer has a thickness equal to the thickness of the drift layer.

In contrast, in the super junction structure, the width of the depletion layer is determined by the depth of pillar layers. In each pillar layer, a depletion direction is a direction in parallel with a main surface of a semiconductor substrate. If the width of the pillar layer is sufficiently small, the pillar layer is fully depleted with only a low drain voltage.

If the width of the pillar layer is increased, the width of each pillar layer to be depleted is extended, which increases voltage difference between a p-type pillar layer and an n-type pillar layer that is necessary for causing full depletion. That is, with the same voltage increase (dV/dt) per unit time, an extended width of the pillar layer can reduce a depletion distance per unit time, and can thereby reduce a hole current.

In short, holes as majority carriers move from the p-type pillar layer at the time of switching, and the hole current can be reduced by reducing a movement amount of the holes per unit time.

Meanwhile in the element region, all of the p-type pillar layers can be connected to a source electrode, and a hole current that concentrates on one contact is smaller than that in the termination region. Therefore, in the element region, in order to reduce on-resistance in a MOSFET, the width of each individual pillar layer can be reduced to increase channel density.

FIG. 1 is a graph showing extension of a depletion layer from a pn-junction surface, as represented by a depletion-layer width, against an applied voltage at a pn junction where acceptor concentration and donor concentration are uniformly equal in a region. In FIG. 1, the horizontal axis represents an applied voltage (V) and the vertical axis represents a depletion-layer, width (μm), and T1 represents a characteristic when donor concentration (ND) and acceptor concentration (NA) are $1\times10^{16}$ $cm^{-3}$, T2 represents a characteristic when the donor concentration and the acceptor concentration are $2\times10^{16}$ $cm^{-3}$, and T3 represents a characteristic when the donor concentration and the acceptor concentration are $3\times10^{16}$ $cm^{-3}$.

FIG. 1 shows that the depletion-layer width is larger as the applied voltage is larger, and that, with the same applied voltage, the depletion-layer width is smaller as the impurity concentration is higher.

FIG. 1 also shows that an applied voltage of approximately 200 V is required to cause the depletion-layer width to extend up to 2.5 μm when the acceptor concentration and the donor concentration are $1\times10^{16}$ $cm^{-3}$. That is, when a total width of an n-type pillar layer and a p-type pillar layer is 5 μm, the pillar layer is fully depleted with an applied voltage of 200 V. Contrastingly, an applied voltage of 600 V or more is required to obtain a depletion layer width of 4.5 μm. When a total width of an n-type pillar layer and a p-type pillar layer is 9 μm, the pillar layer is partially not depleted with an applied voltage of 200 V, and is not fully depleted until the applied voltage is increased up to approximately 600 V.

In the SJ structure, in obtaining depletion layers having the same area in an n-type pillar layer and a p-type pillar, layer, a large total width of an n-type pillar layer and a p-type pillar layer lessens a rate of depletion against voltage increase, and thereby reduces a rate of emission of electrons from the n-type pillar layer and a rate of emission of holes from the p-type pillar layer. That is, slow progression of depletion lowers the rate of emission of electrons and holes.

FIG. 2 is a graph showing calculated results of a hole current against the width of a p-type pillar layer, where the horizontal axis represents a pillar width (μm) and the vertical axis represents a hole current (arbitrary unit a.u.). In calculation, hypothetically, voltage increase (dV/dt) per unit time is fixed even when the width of the pillar layer is changed, and donor concentration of the n-type pillar layer and acceptor concentration of the p-type pillar layer are each $1\times10^{16}$ $cm^{-3}$. Further, a hole current flowing from the p-type pillar layer is defined based on the number of holes present in a region that is depleted within a unit time. FIG. 2 shows that the hole current can be reduced by roughly half when the pillar width is extended approximately from 5 μm up to 9 μm. Electric potential to be applied to a termination region due to the hole current is proportional to the hole current, and therefore generated electric potential is similarly reduced by half.

First Embodiment

Now, a semiconductor device according to a first embodiment of the present invention is described with reference to FIG. 3 to FIG. 13.

<Device Configuration>

FIG. 3 is a perspective view illustrating a configuration of a vertical MOSFET 100, which is a silicon carbide semiconductor device using silicon carbide in a semiconductor substrate. Note that, the present invention is not applied only to a silicon carbide semiconductor device, and can also be applied to a semiconductor device that uses a semiconductor such as silicon (Si), gallium nitride (GaN), and diamond (C), and has the super junction structure.

As compared to a Si semiconductor device, a silicon carbide semiconductor device using silicon carbide in a semiconductor substrate can yield a semiconductor device that has an excellent breakdown voltage, high allowable current density, excellent heat resistance, and capability of operation under high temperature.

Note that, in the description below concerning conductivity types of impurity, general definition is applied, in which an n type is referred to as a "first conductivity type" and a p type is referred to as a "second conductivity type," but the definition may be reversed.

As illustrated in FIG. 3, in the vertical MOSFET 100, an n-type epitaxial crystal growth layer 4 (a semiconductor layer) is provided on one main surface of an n-type semiconductor substrate 3 formed of silicon carbide, a plurality of p-type well regions 7 are selectively provided in an upper layer portion of the epitaxial crystal growth layer 4, and a p-type contact region 10*a* is provided in each well region 7 to penetrate the well region 7. Note that, the epitaxial crystal growth layer 4 is also referred to as a drift layer.

Further, in an upper layer portion of each well region 7, an n-type source region 8 is provided in contact with both side surfaces of the contact region 10*a*. Note that, the source region 8 is provided such that the thickness thereof is smaller than the thickness of the well region 7, and the contact region 10*a* is provided such that the thickness thereof is roughly equal to or slightly larger than the thickness of the well region 7.

A gate insulating film 12 is selectively formed on the epitaxial crystal growth layer 4, and a gate electrode 13 is formed on the gate insulating film 12. Specifically, the gate insulating film 12 is provided between adjacent source regions 8 and is extended from a partial upper portion of one source region 8 over one well region 7 and the epitaxial crystal growth layer 4 to a partial upper portion of another source region 8 of an adjacent well region 7. The gate electrode 13 is provided to cover the gate insulating film 12.

Further, an interlayer insulating film 14 is formed to cover the gate insulating film 12 and the gate electrode 13, and a source electrode 15 is formed to cover the interlayer insulating film 14. In a region of the interlayer insulating film 14 except the region covering the gate electrode 13, a contact hole SC is provided, which penetrates the interlayer insulating film 14 in the thickness direction and reaches a part of the source region 8 and the entire surface of the contact region 10a. Further, the source electrode 15 is filled in the contact hole SC, and the source electrode 15 is thereby connected to the source region 8 and the contact region 10a.

A plurality of MOSFET elements, each of which is formed of the source regions 8 and others as described above, are arrayed in a direction parallel with the main surface of the semiconductor substrate 3, and are connected in parallel to form an element group. A region provided with the element group is referred to as an element region (an active region) ER, and a termination region TR for attaining a breakdown voltage of the vertical MOSFET 100 is provided at an outer peripheral portion of the element region ER.

In an upper layer portion of the epitaxial crystal growth layer 4 in the termination region TR, a p-type contact region 10b is provided to define an outer edge of the element region ER. The contact region 10b is provided so as to have a thickness equal to the thickness of the contact region 10a, but the width thereof (a length in a direction in parallel with the main surface of the semiconductor substrate 3) is larger than the width of the contact region 10a.

Further, a p-type RESURF region 9 is provided on an outer side of the contact region 10b so as to have a thickness roughly equal to the thickness of the contact region 10b.

Further, in the epitaxial crystal growth layer 4, a plurality of n-type pillar layers 5a and p-type pillar layers 6a are provided to be alternately arrayed in equal numbers in the element region ER, and a plurality of n-type pillar layers 5b and p-type pillar layers 6b are provided to be alternately arrayed in a formation region of the contact region 10b and the RESURF region 9 in the termination region TR. Note that, in the termination region TR that is located on an outer side with respect to a disposition region of the n-type pillar layers 5b and the p-type pillar layers 6b, another plurality of n-type pillar layers 5a and p-type pillar layers 6a are provided to be alternately arrayed.

Each pillar layer is provided to extend from an uppermost surface of the epitaxial crystal growth layer 4 toward the semiconductor substrate 3 side in the depth direction of the epitaxial crystal growth layer 4, and the deepest portion thereof is set to be shallower than the thickness of the epitaxial crystal growth layer 4.

Note that, the width of each of the n-type pillar layer 5a and the p-type pillar layer 6a is equal, and a total value of both of the widths is represented by a pillar pitch W1. Further, the width of each of the n-type pillar layer 5b and the p-type pillar layer 6b is also equal, and each width thereof is set to be larger than the width of each of the n-type pillar layer 5a and the p-type pillar layer 6a. A pillar pitch W2, which is a total value of the width of each of the n-type pillar layer 5b and the p-type pillar layer 6b, is larger than the total width W1.

Further, in the termination region TR, a field insulating film 11 is provided on, the epitaxial crystal growth layer 4, and the interlayer insulating film 14 is provided on the field insulating film 11.

The source electrode 15 is provided to extend from the element region ER up to a position over a stacked film of the field insulating film 11 and the interlayer insulating film 14 in the termination region TR. Further, in a region of the stacked film of the field insulating film 11 and the interlayer insulating film 14 corresponding to a portion above the contact region 10b, a contact hole TC is provided, which penetrates the stacked film in the thickness direction and reaches the contact region 10b. Further, the source electrode 15 is filled in the contact hole TC, and the source electrode 15 is thereby connected to the contact region 10b.

Note that, the stacked film of the field insulating film 11 and the interlayer insulating film 14 is provided to cover a partial upper portion of the MOSFET element on the outermost periphery of the element region ER. A passivation film 17 is provided to cover a partial upper portion of the source electrode 15 and an upper portion of the stacked film of the field insulating film 11 and the interlayer insulating film 14.

Further, a drain electrode 16 is provided on another main surface (back surface) of the semiconductor substrate 3, which is opposite to a side where the source electrode 15 is provided.

In the vertical MOSFET 100 having the configuration described above, when a voltage is applied to the gate electrode 13, a channel is formed in an upper layer portion of the well region 7 that is located between the epitaxial crystal growth layer 4 and the source region 8 immediately below the gate electrode 13. Through this channel, the source region 8 and the source electrode 15 are electrically connected via the well region 7, the n-type pillar layer 5a, the epitaxial crystal growth layer 4, and the semiconductor substrate 3.

<Manufacturing Method>

Figure 4:
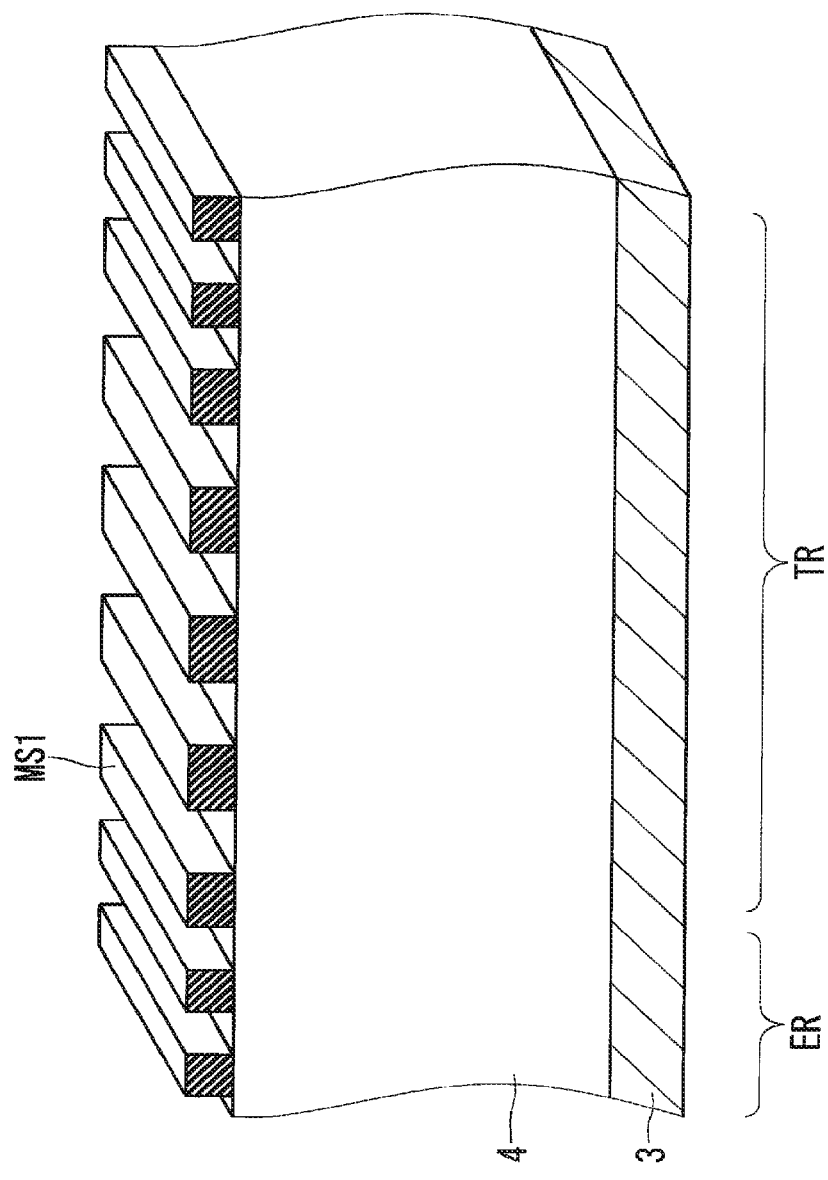
FIG. 4 is a perspective view illustrating a manufacturing process of the semiconductor device according to the first embodiment of the present invention.

Next, a manufacturing process of the vertical MOSFET 100 is described with reference to FIG. 4 to FIG. 13. First, as illustrated in FIG. 4, the n-type epitaxial crystal growth layer 4 is formed with an epitaxial crystal growth method on one main surface of the n-type semiconductor substrate 3 formed of silicon carbide.

The crystal-plane orientation of the semiconductor substrate 3 may be inclined by 8° or less with respect to the c-axis direction, or may not be inclined. Alternatively, the semiconductor substrate 3 may have any plane orientation. Impurity concentration of the epitaxial crystal growth layer 4 ranges from $1\times10^{13}$ to $1\times10^{18}$ cm$^{-3}$, for example, and, the thickness of the epitaxial crystal growth layer 4 is from 5 to 200 μm, for example.

Figure 5:
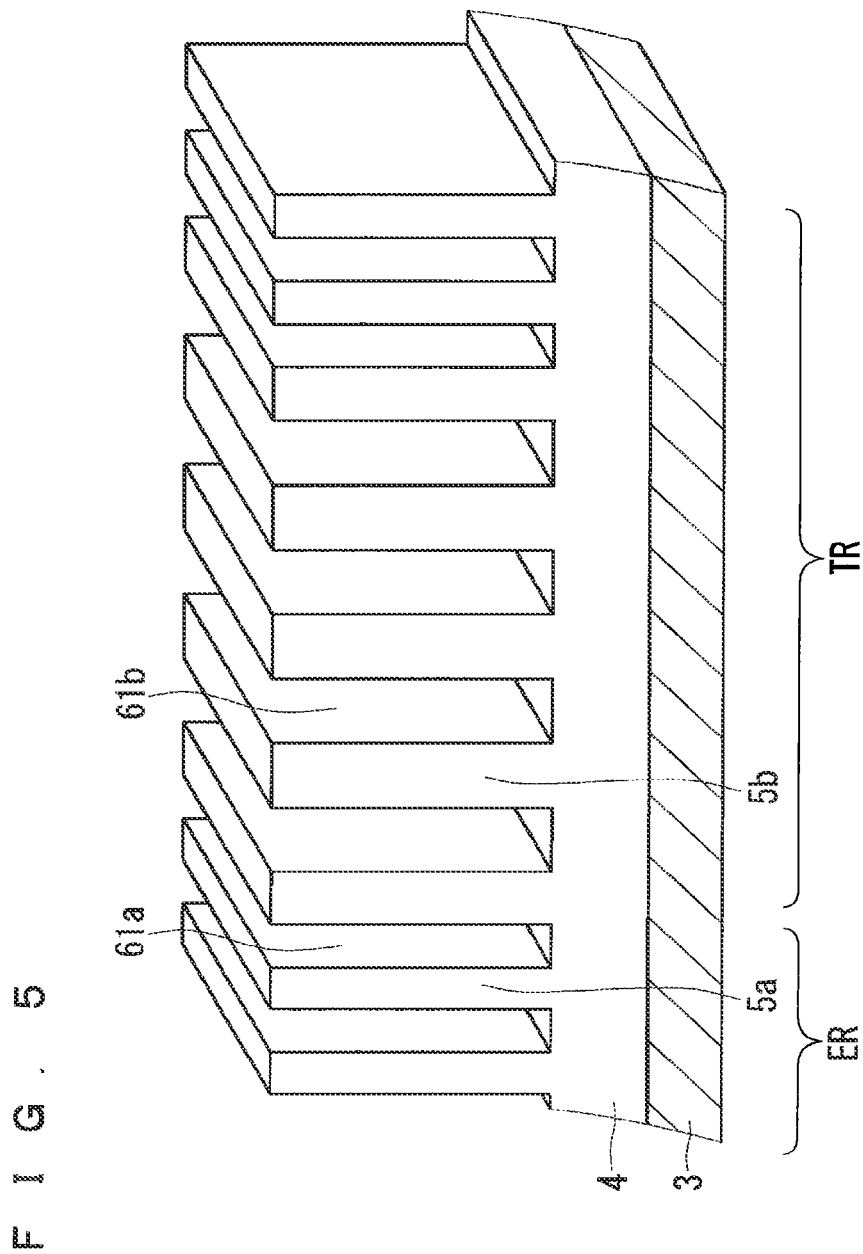
FIG. 5 is a perspective view illustrating a manufacturing process of the semiconductor device according to the first embodiment of the present invention.

Then, with a process such as photolithography, an oxide-film mask MS1 is formed on the epitaxial crystal growth layer 4, for example, and a surface of the epitaxial crystal growth layer 4 is etched using the oxide-film mask MS1 as an etching mask. With this, as illustrated in FIG. 5, trenches 61a and 61b to respectively become the p-type pillar layers 6a and 6b are formed. As the etching for a surface of the epitaxial crystal growth layer 4, either of wet etching or dry etching may be employed. However, because the aspect ratio between width and depth of a p-type pillar layer used in the super junction structure matches that of the shape of the trench, it is desirable to employ dry etching, such as reactive ion etching or sputter etching, with which control of the shape is comparatively easy.

It is preferred that the depth of the trenches 61a and 61b not exceed the thickness of the epitaxial crystal growth layer 4. In the epitaxial crystal growth layer 4, a region below the bottom surface of the trenches 61a and 61b is referred to as a buffer layer.

Figure 6:
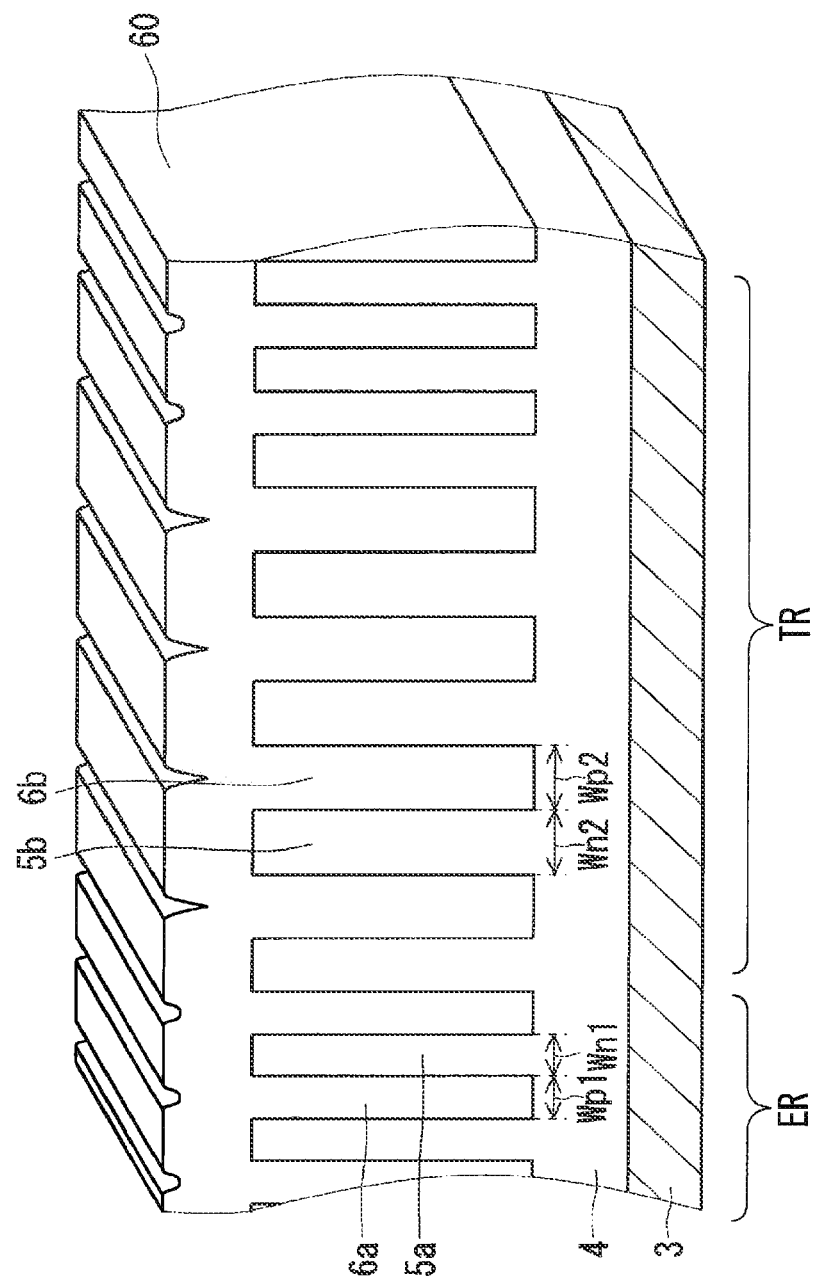
FIG. 6 is a perspective view illustrating a manufacturing process of the semiconductor device according to the first embodiment of the present invention.

Next, in a process illustrated in FIG. 6, a p-type semiconductor is filled in the trenches 61a and 61b to form the p-type pillar layers 6a and 6b. In this process, the p-type semiconductor is formed on the epitaxial crystal growth layer 4 by epitaxial crystal growth, and a p-type semiconductor layer 60 is thereby formed inside the trenches 61a and 61b and on the n-type pillar layers 5a and 5b. In this case, level difference is generated in a surface of the p-type semiconductor layer 60 at portions obtained by filling the trenches 61a and 61b. Note that, the trenches 61a and 61b are desirably completely filled by the p-type semiconductor layer 60, but the trenches 61a and 61b need not necessarily be filled completely.

Here, epitaxial crystal growth of the p-type semiconductor layer 60 is conducted under conditions such that the p-type pillar layers 6a and 6b attain designed acceptor concentration. Specifically, in the element region ER, acceptor concentration NA in the p-type pillar layer 6a is supposed to keep charge balance of the pillar layer, and is set such that a relationship of Wn1×ND=Wp1×NA holds, where Wn1 represents the width of the n-type pillar layer 5a, ND represents impurity concentration of the n-type pillar layer 5a, Wp1 represents the width of the p-type pillar layer 6a, and NA represents impurity concentration of the p-type pillar layer 6a. Note that, impurity concentration ND of the n-type pillar layer 5a ranges from $1 \times 10^{13}$ to $1 \times 10^{18}$ cm$^{-3}$, which is the same as the impurity concentration of the epitaxial crystal growth layer 4.

In the embodiments, the acceptor concentration and the donor concentration hereinafter each represent effective impurity concentration. The effective impurity concentration is impurity concentration of impurity limited to electrically active impurity, among impurities taken into the semiconductor substrate.

When the thickness of the buffer layer is large and thus cannot be ignored in taking consideration of charge balance between pillars, the acceptor concentration NA is set such that a relationship of Wn1×Dp1×ND+(Wn1+Wp1)×TB×NDB=Wp1×Dp1×NA holds, with a depth Dp1 of the pillar layer, a thickness TB of the buffer layer, and impurity concentration NDB of the buffer layer being included.

In FIG. 3, the width of each of the n-type pillar layer 5a and the p-type pillar layer 6a in the element region ER is equal, but may be different. Further, the width of each of the n-type pillar layer 5b and the p-type pillar layer 6b in the termination region TR is equal, but may be different.

Further, in the element region ER and the termination region TR, donor concentrations (ND) of the n-type pillar layers 5a and 5b are equal to each other, and acceptor concentrations (NA) of the p-type pillar layers 6a and 6b are also equal to each other. With this, a breakdown voltage that can be expected by the super junction structure can be securely obtained in both of the regions.

Note that, donor concentrations (ND) of the n-type pillar layers 5a and 5b and acceptor concentrations (NA) of the p-type pillar layers 6a and 6b may be either equal or different.

Also in the termination region TR, the width Wn2 of the n-type pillar layer 5b and the width Wp2 of p-type pillar layer 6b are set such that a relationship of Wn2×ND=Wp2×NA holds. When the donor of the buffer layer cannot be ignored also in the termination region TR, the configuration is set such that a relationship of Wn2×Dp1×ND+(Wn2+Wp2)×TB×NDB=Wp2×Dp1 NA holds.

Further, the pillar pitch W1 (Wn1+Wp1) of the n-type pillar, layer 5a and the p-type pillar layer 6a in the element region ER and the pillar pitch W2 (Wn2+Wp2) in the termination region TR, are set such that a relationship of W1<W2 holds. This configuration can reduce a current generated by majority carriers emitted from the p-type pillar layers 6b in the termination region when the MOSFET is turned off, or by majority carriers (holes, in this case) injected into the p-type pillar layers 6b in the termination region when the MOSFET is turned on. When a current is reduced, electric potential generated in the termination region is reduced, and dV/dt resistance of the semiconductor device is improved. Note that, in this embodiment, W1×2=W2.

Figure 7:
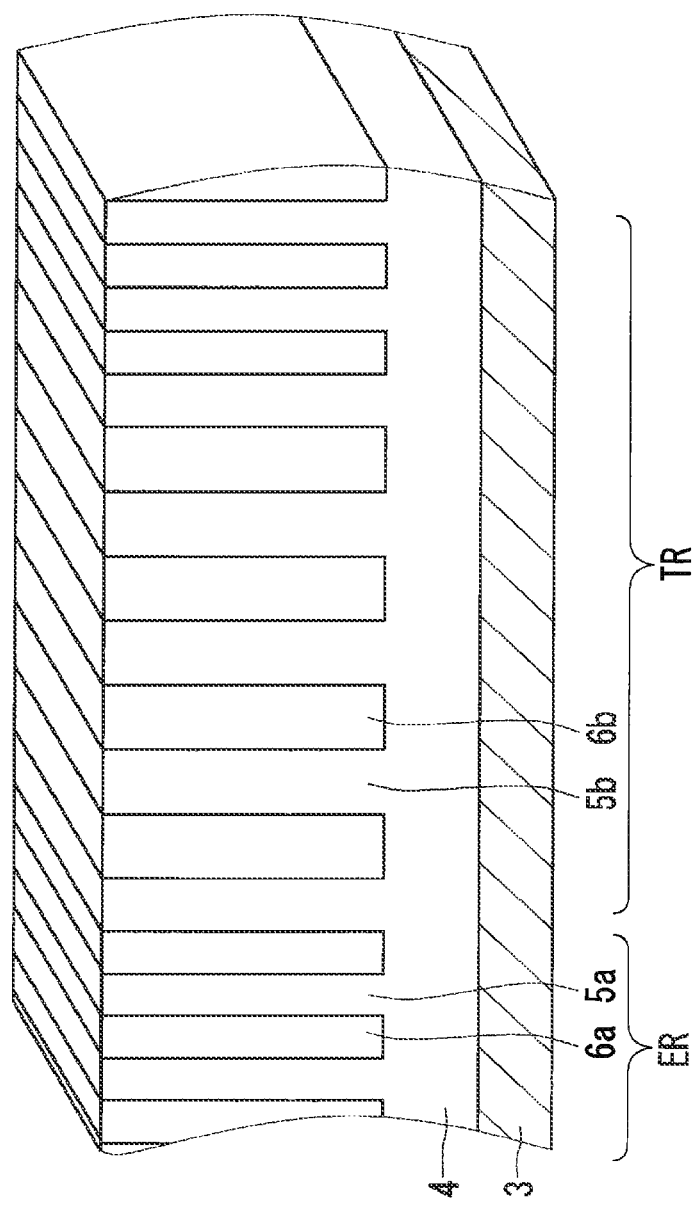
FIG. 7 is a perspective view illustrating a manufacturing process of the semiconductor device according to the first embodiment of the present invention.

Next, in a process illustrated in FIG. 7, the p-type semiconductor layer is removed by chemical mechanical polishing (CMP) until upper portions of the n-type pillar layers 5a and 5b and the p-type pillar layers 6a and 6b are exposed, to thereby planarize the epitaxial crystal growth layer 4.

Figure 8:
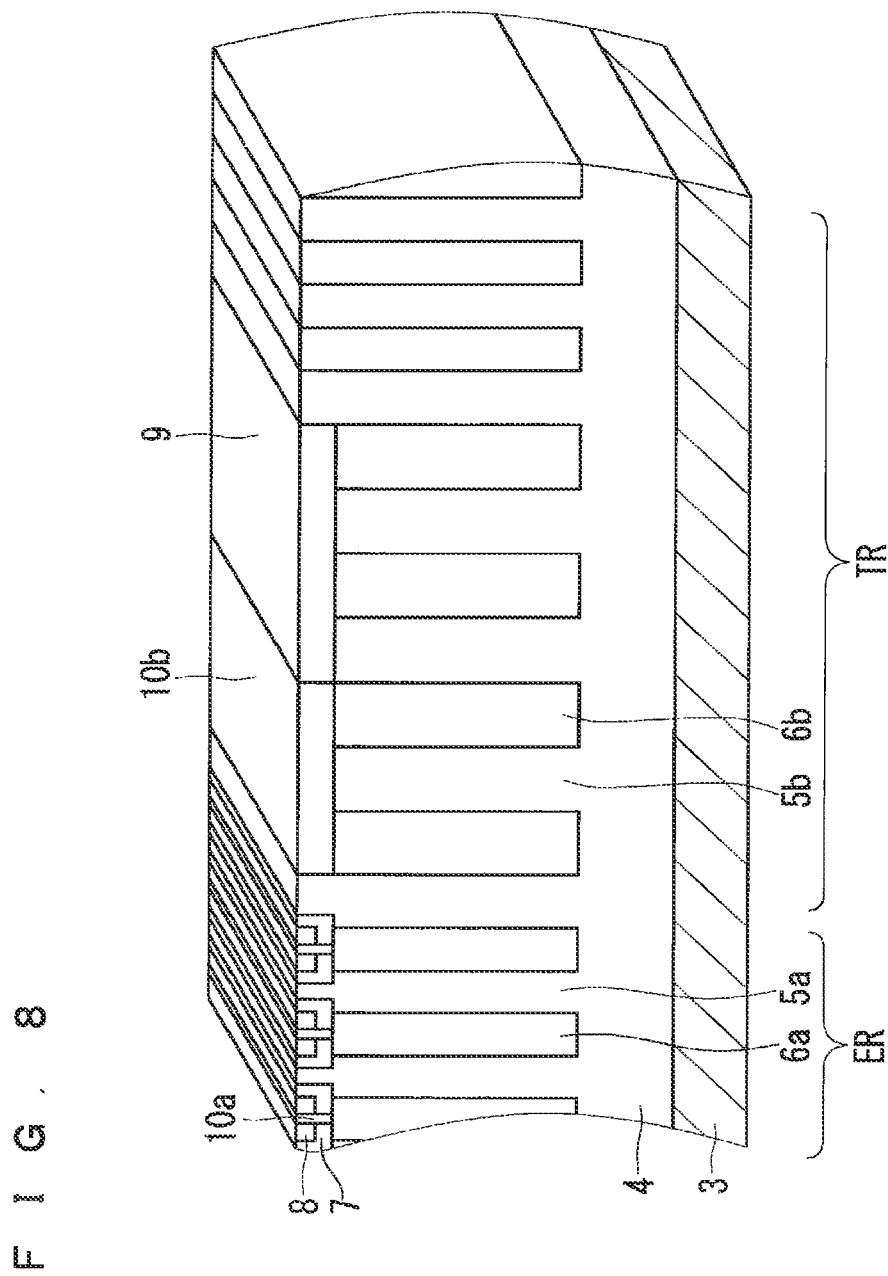
FIG. 8 is a perspective view illustrating a manufacturing process of the semiconductor device according to the first embodiment of the present invention.

Then, in a process illustrated in FIG. 8, impurity ions are implanted using a resist mask (not shown) that is patterned with photolithography, and the well region 7, the source region 8, the RESURF region 9, and the contact regions 10a and 10b are thereby selectively formed in an upper layer portion of the epitaxial crystal growth layer 4.

Here, p-type impurity is introduced into the well region 7, the RESURF region 9, and the contact regions 10a and 10b, and n-type impurity is introduced into the source region 8.

Impurity concentration of the well region 7 and the RESURF region 9 desirably ranges from $1 \times 10^{15}$ to $1 \times 10^{19}$ cm$^{-3}$, and the depth thereof ranges from 0.3 to 4.0 μm, for example. Impurity concentration of the source region 8 exceeds the range of the impurity concentration of the well region 7, and desirably ranges from $1 \times 10^{18}$ to $1 \times 10^{21}$ cm$^{-3}$, for example. Further, the depth of the source region 8 is depth not exceeding that of the well region 7.

As for the contact regions 10a and 10b, ions can be implanted using the same resist mask, and impurity concentration desirably ranges from $1 \times 10^{18}$ to $1 \times 10^{21}$ cm$^{-3}$. Note that, the ion implantation is desirably conducted with a temperature of the substrate being 200° C. or more.

Note that, the contact regions 10a and 10b are regions provided in order to achieve satisfactory metal contact with the well region 7 and the RESURF region 9, and the semiconductor device operates without providing the contact regions 10a and 10b.

Further, although not shown, after impurity is introduced, a heat treatment is performed for 0.5 to 60 minutes at a temperature of 1500 to 2200° C., for example, in an inert gas, such as argon or nitrogen, or in a vacuum. This electrically activates implanted impurity. After that, an oxide film is formed on the epitaxial crystal growth layer 4 with sacrificial oxidation. Subsequently, an altered surface layer in the epitaxial crystal growth layer 4 is removed with oxide-film removal using hydrofluoric acid to obtain a clean surface.

As illustrated in FIG. 8, in the element region ER, the well region 7 is formed to cover an upper layer portion of the p-type pillar layer 6a, and the p-type pillar layer 6a is electrically connected to the source electrode 15 (FIG. 3) via the contact region 10a. Further, in the termination region TR, the contact region 10b and the RESURF region 9 are formed to be extended over an upper layer portion of the plurality of p-type pillar layers 6b to cover the upper layer portions. The plurality of p-type pillar layers 6b that are covered by the contact region 10b have equal electric potential via the contact region 10b, and the plurality of p-type pillar layers 6b that are covered by the RESURF region 9 have equal electric potential via the RESURF region 9. Further, the contact region 10b and the RESURF region 9 are provided such that side surfaces thereof come in contact with each other, and therefore the p-type pillar layers 6b covered by the contact region 10b are electrically connected to the source electrode 15 (FIG. 3) via the contact region 10b.

Figure 9:
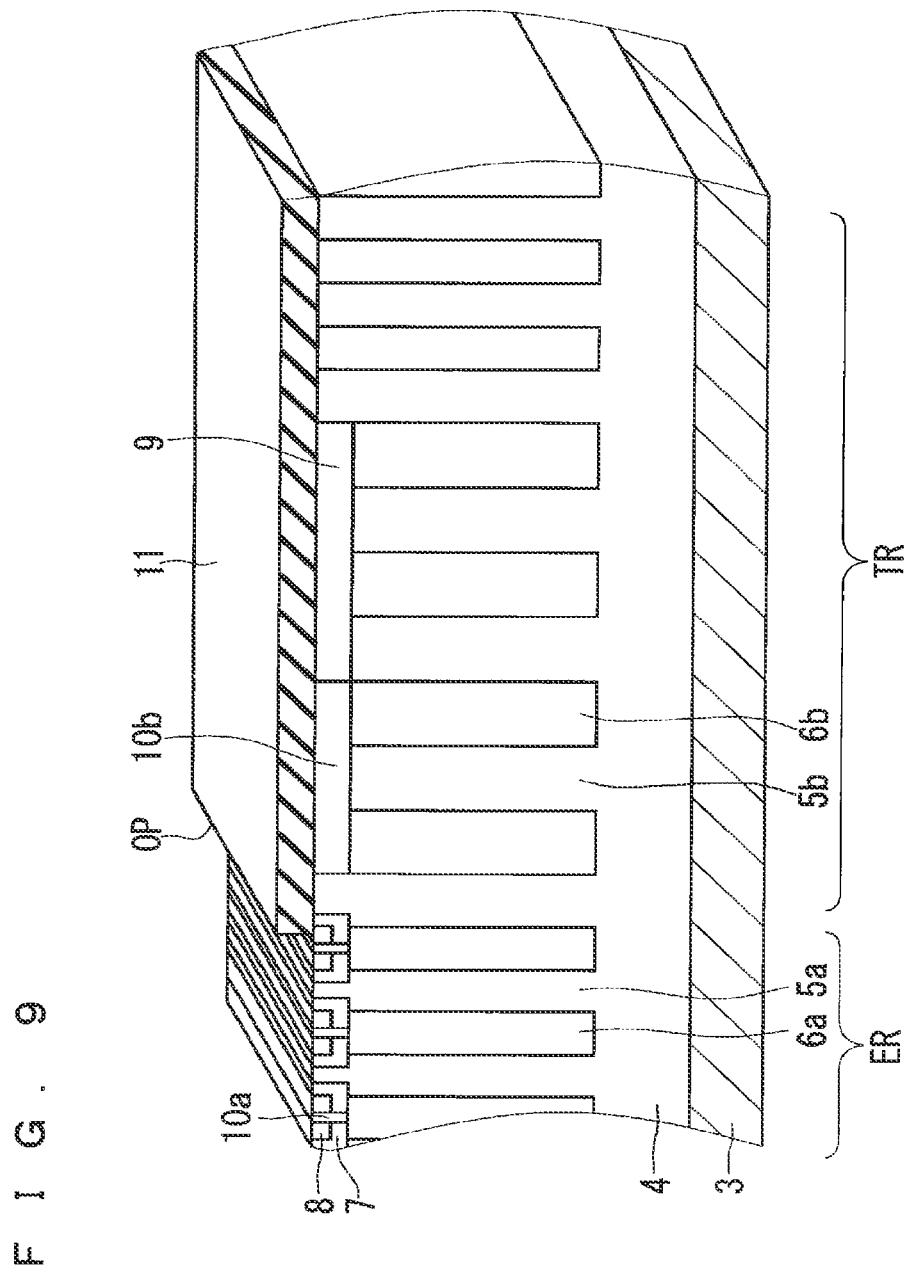
FIG. 9 is a perspective view illustrating a manufacturing process of the semiconductor device according to the first embodiment of the present invention.

Next, in a process illustrated in FIG. 9, a silicon oxide film is formed on the epitaxial crystal growth layer 4 with chemical vapor deposition (CVD). The silicon oxide film is then patterned using a resist mask (not shown) that is patterned with photolithography, to form the field insulating film 11 that has an opening OP only in the element region (active region). For the removal of the field insulating film 11, dry etching using carbon tetrafluoride ($CF_4$) or the like, or wet etching using hydrogen fluoride or the like is employed.

Note that, the field insulating film 11 is not limited to a silicon oxide film, and may be formed of a silicon nitride film or of another insulating film.

Figure 10:
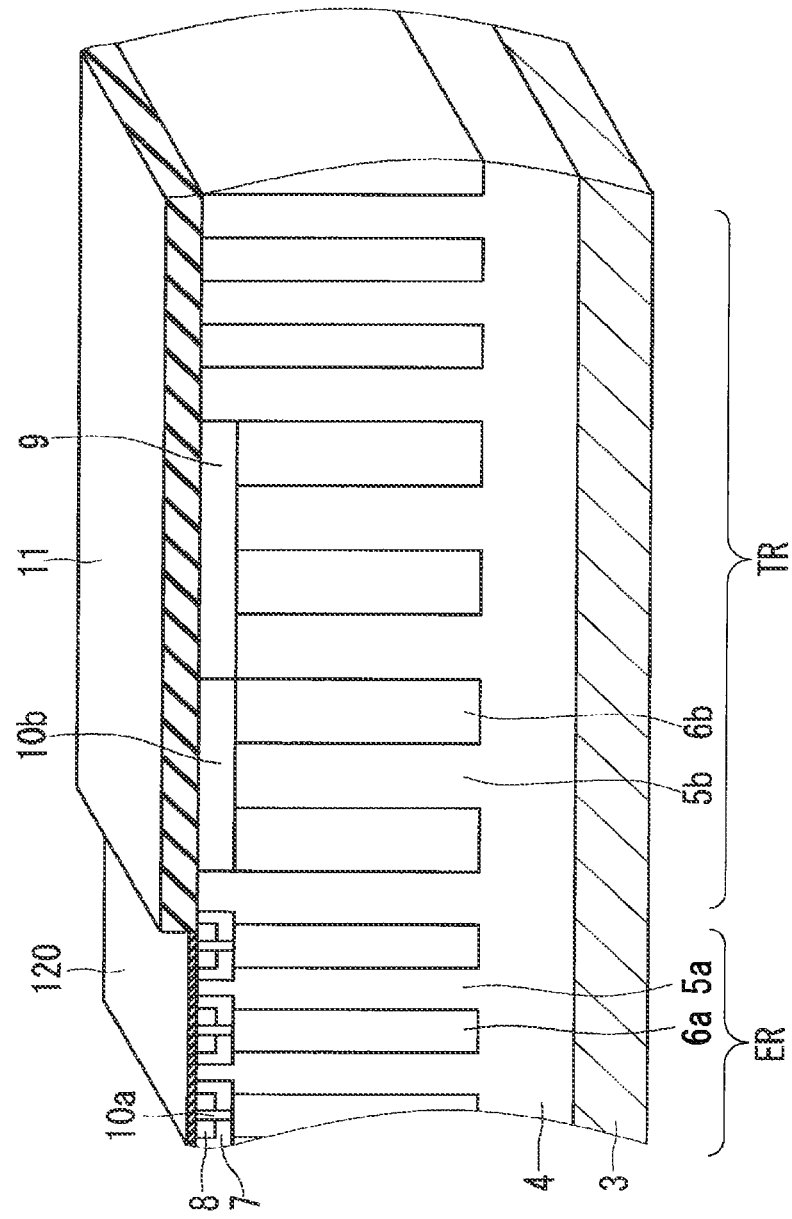
FIG. 10 is a perspective view illustrating a manufacturing process of the semiconductor device according to the first embodiment of the present invention.

Next, in a process illustrated in FIG. 10, an insulating film 120 to form the gate insulating film 12 is formed in the element region ER that is exposed in the opening OP of the field insulating film 11. The insulating film 120 is formed on the entire substrate surface with thermal oxidation or CVD, for example, and is also formed on the field insulating film 11, but illustration thereof is omitted.

Next, a conductive film to form the gate electrode 13 is formed on the insulating film 120. In general, the gate electrode 13 is formed of polysilicon that contains impurity in high concentration. A conductive film is formed on the entire substrate surface with CVD using polysilicon, and then an unnecessary part is removed by dry etching. With this, as illustrated in FIG. 3, the gate electrode 13 is provided between adjacent source regions 8 and is extended from a partial upper portion of one source region 8 over one well region 7 and the epitaxial crystal growth layer 4 (one n-type pillar layer 5a) to a partial upper portion of another source region 8 of an adjacent well region 7.

Figure 11:
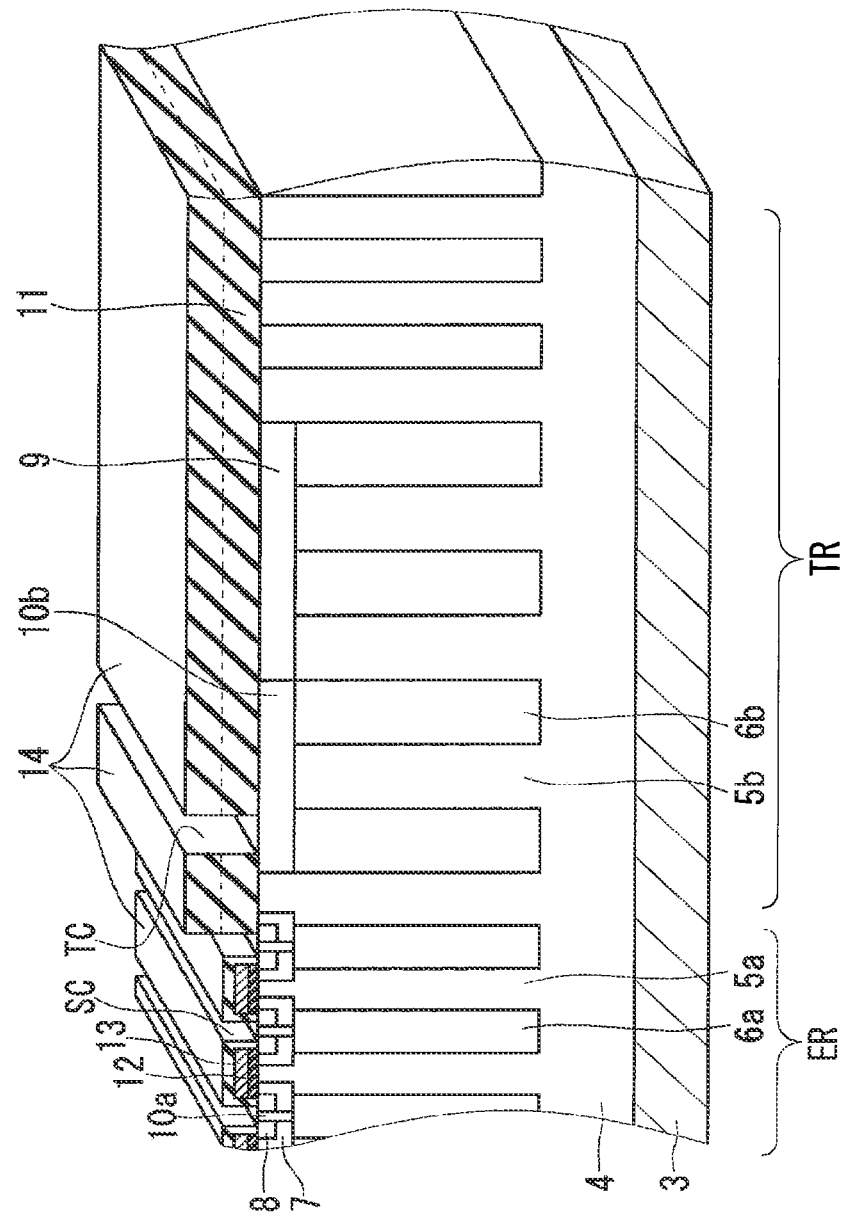
FIG. 11 is a perspective view illustrating a manufacturing process of the semiconductor device according to the first embodiment of the present invention.

Next, the interlayer insulating film 14 is formed on the entire substrate surface with CVD, for example, to cover the gate electrode 13 and the field insulating film 11. After that, as illustrated in FIG. 11, the contact hole SC penetrating the interlayer insulating film 14 in the thickness direction and reaching a part of the source region 8 and the entire surface of the contact region 10a, and the contact hole TC penetrating the stacked film of the interlayer insulating film 14 and the field insulating film 11 in the thickness direction and reaching the contact region 10b are formed. The contact holes SC and TC are formed into a slit-like shape.

Note that, when the contact hole SC is formed, the insulating film 120 remaining on the epitaxial crystal growth layer 4 is also simultaneously removed.

Figure 12:
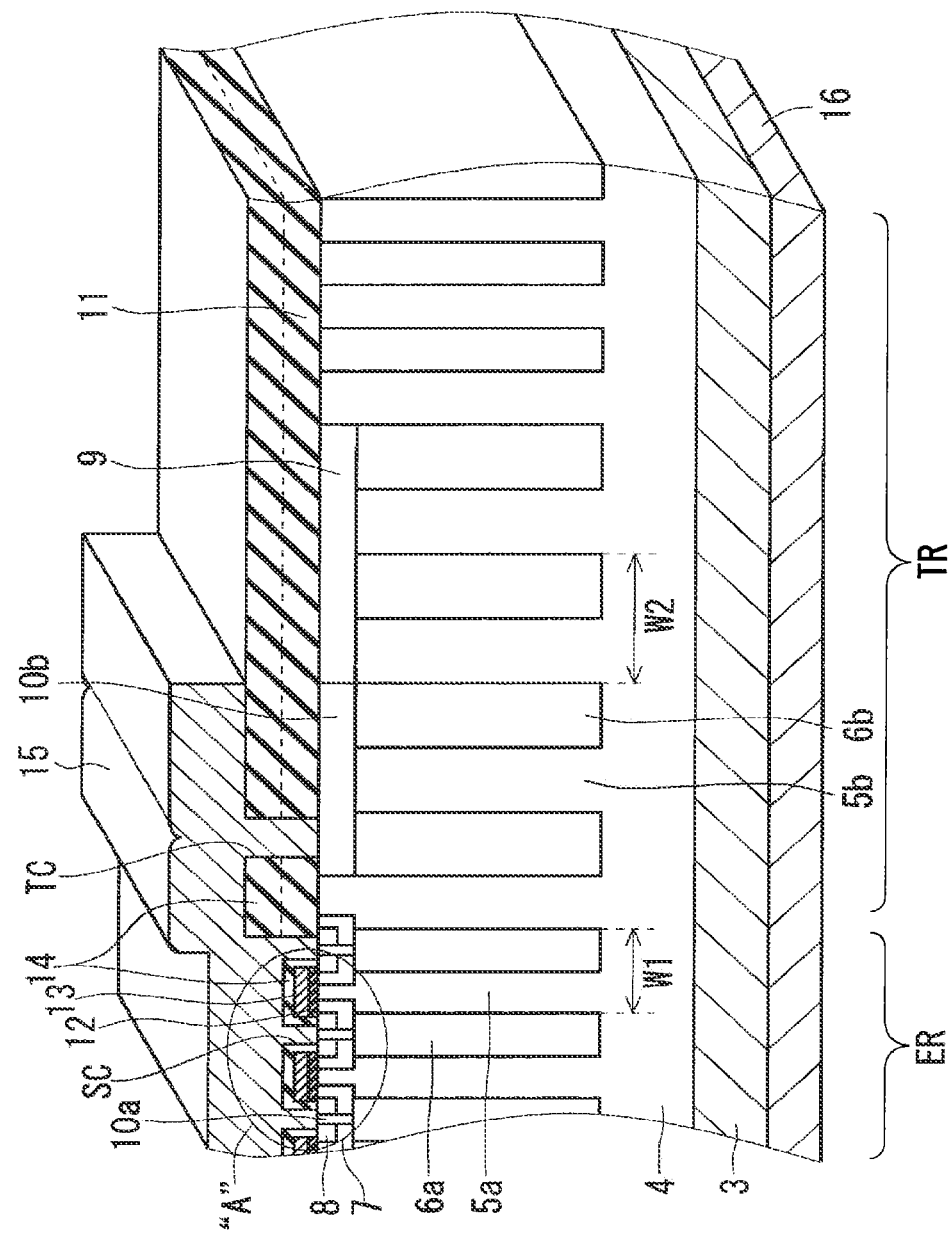
FIG. 12 is a perspective view illustrating a manufacturing process of the semiconductor device according to the first embodiment of the present invention.
Figure 13:
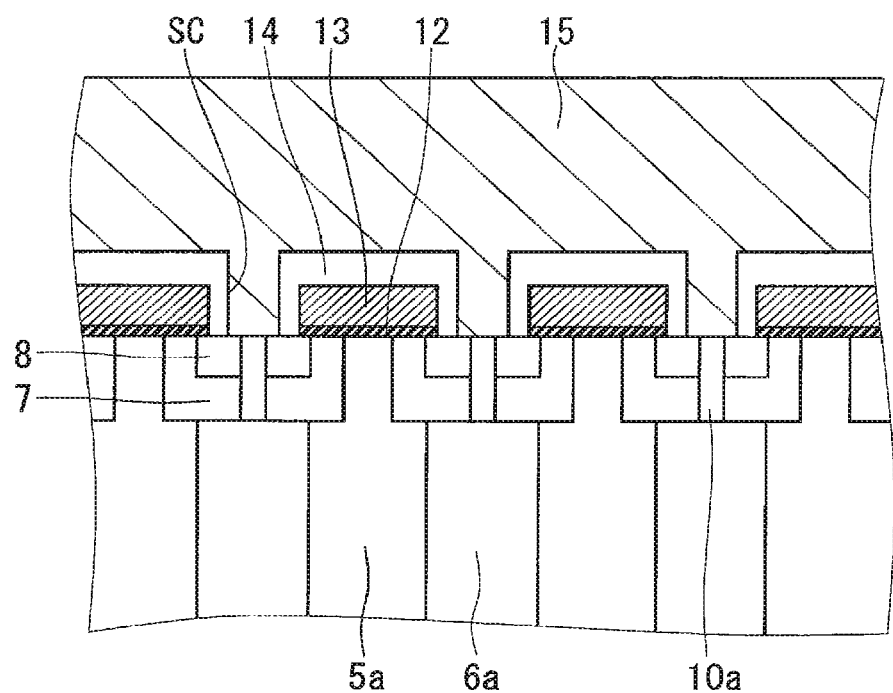
FIG. 13 is a view illustrating a manufacturing process of the semiconductor device according to the first embodiment of the present invention.

Next, in a process illustrated in FIG. 12, the source electrode 15 that is filled in the contact holes SC and TC and comes in contact with the source region 8 and the contact regions 10a and 10b is formed. Further, gate wiring (not shown) to be connected to the gate electrode 13 is formed in a region outside of the element region ER. The configuration of the part "A" of FIG. 12 is illustrated in FIG. 13. After that, the drain electrode 16 is formed on the back surface of the semiconductor substrate 3. Note that, the source, electrode 15 and the drain electrode 16 are formed of metal, such as aluminum (Al), titanium (Ti), copper (Cu), and gold (Au), or of an alloy thereof, and are formed with a sputtering method or a vapor deposition method, for example.

Note that, a silicide layer formed by reaction of nickel (Ni) or the like and silicon carbide may be formed on a surface of the epitaxial crystal growth layer 4 to come in contact with the source electrode 15 and the drain electrode 16. With a silicide layer, reduction in contact resistance with each electrode can be expected.

Finally, the passivation film 17 is provided to cover a partial upper portion of the source electrode 15 and an upper portion of the stacked film of the field insulating film 11 and the interlayer insulating film 14, using an insulating material such as polyimide or a silicon oxide film. With this, the vertical MOSFET 100 illustrated in FIG. 3 is completed. The passivation film 17 is provided in the termination region TR without the source electrode 15 and reduces surface discharge, thereby having an effect of further improving a breakdown voltage of the termination region TR.

When the MOSFET is turned off, each pillar, layer emits majority carriers to the outside of the pillar to deplete the majority carriers. In the element region ER, holes emitted from the p-type pillar layer 6a move to the source electrode 15 via the contact region 10a. Meanwhile, in the termination region TR, holes emitted from the p-type pillar layer 6b move to the source electrode 15 via the contact region 10b, or are emitted to the source electrode 15 via the RESURF region 9 and the contact region 10b in phases.

When the pillar pitch W2 in the termination region TR is small, i.e., when extension of the depletion layer is small in each pillar, electric potential generated in the RESURF region 9 and the contact region 10b is increased by a hole current. In this embodiment, however, such increase is reduced.

Contrarily in this embodiment, the pillar pitch in the termination region TR is set to be twice the pillar pitch in the element region ER. Therefore, as compared to the case where the pillar-layer width is equal in the element region ER and the termination region TR, electric potential generated in the RESURF region 9 and the contact region 10b can be reduced by approximately up to half, and dV/dt resistance of the semiconductor device can be improved.

Further, the p-type pillar layers 6a and 6b are formed with a trench filling method. Therefore, impurity concentration of the n-type pillar layers 5a and 5b can be fixed to be n-type impurity concentration of the epitaxial crystal growth layer 4. Further, productivity can be improved as compared to the case where all of the pillar layers are formed with a multi-epitaxial method.

<Modification>

In the vertical MOSFET 100 illustrated in FIG. 3, an end of the source electrode 15 as viewed from the source electrode 15 side is provided to be aligned with the position of an end of the contact region 10b. However, the end of the source electrode 15 may be provided on the inner side with respect to the contact region 10b, provided on the inner side with respect to the RESURF region 9, or provided on the outer side with respect to an end of the RESURF region 9. Further, one or more field plates may be provided on the field insulating film 11 on the outer side of the source electrode 15 to surround the source electrode 15. Adjustment of electric potential of the field plate can control curvature of a corner of the depletion layer, and thus a breakdown voltage in the termination region TR can further be improved.

Second Embodiment

In the vertical MOSFET 100 according to the first embodiment described above, every pillar pitch W2 in the termination region TR is equal in a region below the RESURF region 9 and the contact region 10b so as to improve dV/dt resistance of the semiconductor device, but this configuration is not restrictive.

Figure 14:
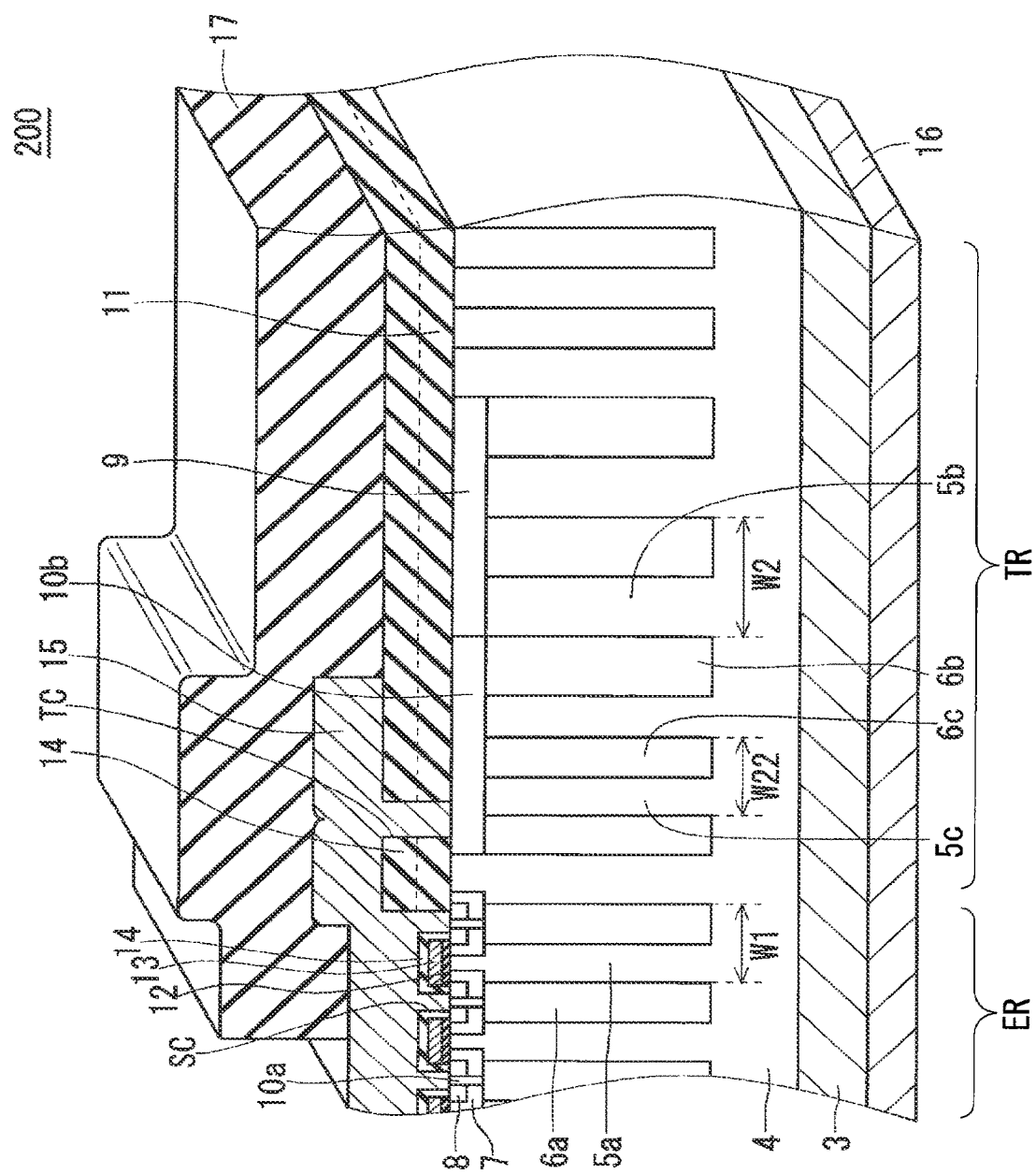
FIG. 14 is a perspective view illustrating a configuration of a semiconductor device according to a second embodiment of the present invention.

Specifically, in a vertical MOSFET 200 according to a second embodiment, as illustrated in FIG. 14, in a region below the RESURF region 9 and the contact region 10b, a pillar pitch W22, which is a total value of the width of each of an n-type pillar layer 5c and a p-type pillar layer 6c that are provided m a region close to the element region ER, and the pillar pitch W2 of other pillar layers are different, and are set such that a relationship of W22<W2 holds.

Here, the pillar pitch W22 of the pillar layers provided in a region close to the element region ER may be set to be equal to the pillar pitch W1 in the element region ER, or may be set to be a different width.

In this manner, simply by increasing at least the pillar pitch at a position far from a connecting point with the source electrode 15 in the termination region TR, the effect of improving dV/dt resistance of the semiconductor device can be obtained.

Third Embodiment

In the vertical MOSFET 100 according to the first embodiment, the pillar layers surround the outermost periphery of the termination region TR, but this configuration is not restrictive.

Figure 15:
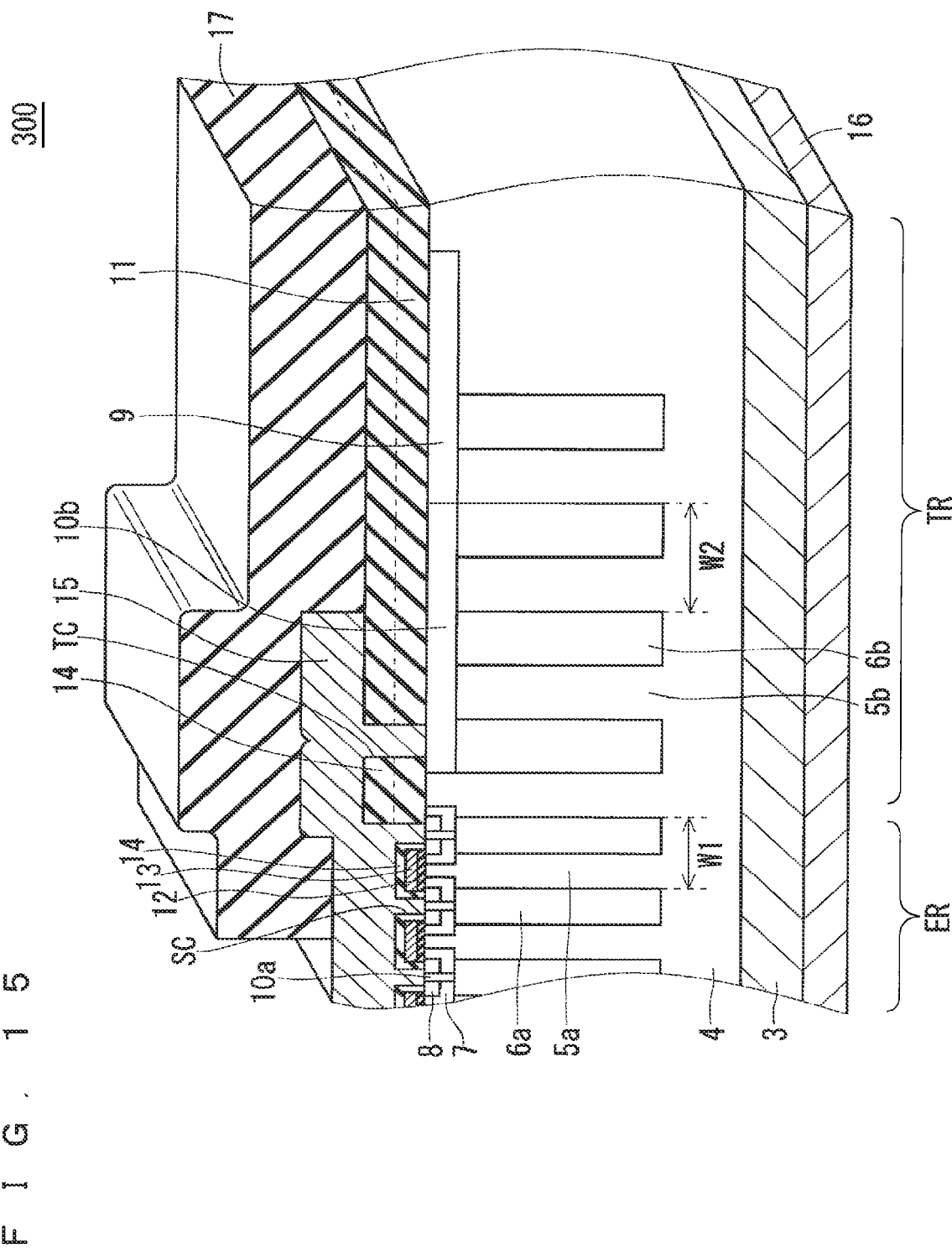
FIG. 15 is a perspective view illustrating a configuration of a semiconductor device according to a third embodiment of the present invention.

Specifically, in a vertical MOSFET 300 according to a third embodiment, as illustrated in FIG. 15, the RESURF region 9 extends up to the outermost periphery of the termination region, and no pillar layers are provided on the outermost periphery of the termination region.

Note that, the pillar pitch in the termination region TR is set to be twice the pillar pitch of pillar layers in the element region ER. Therefore, as compared to the case where the pillar-layer width is equal in the element region ER and the termination region TR, electric potential generated in the RESURF region 9 and the contact region 10b can be reduced by approximately up to half, and dV/dt resistance of the semiconductor device can be improved.

<Modification>

A breakdown voltage in the termination region TR can further be improved by providing the RESURF region 9. In place of the RESURF region 9, however, a termination structure, such as a guard ring structure, a junction termination extension (JTE) structure, a field limiting ring (FLR) structure, and a variation of lateral doping (VLD) structure may be provided on the outermost periphery of the termination region TR.

In the guard ring structure, an annular impurity region is provided in an upper layer portion of a termination region along the termination region. A reverse bias is applied to the impurity region to form a depletion layer, and electric field concentration is thereby lessened.

In the JTE structure, an annular impurity region is provided along a termination region such that impurity concentration is gradually lowered toward the outer side of the termination region.

In the VLD structure, an impurity region is distributed by controlling impurity concentration in a direction parallel with a surface of a substrate by an opening pattern of an implantation mask.

Fourth Embodiment

In the vertical MOSFET 100 according to the first embodiment, planar-channel MOSFET in which a channel is formed in a direction parallel with a substrate is illustrated.

In a fourth embodiment, the present invention is applied to a trench-channel MOSFET in which a channel is formed in a direction perpendicular to a substrate.

Figure 16:
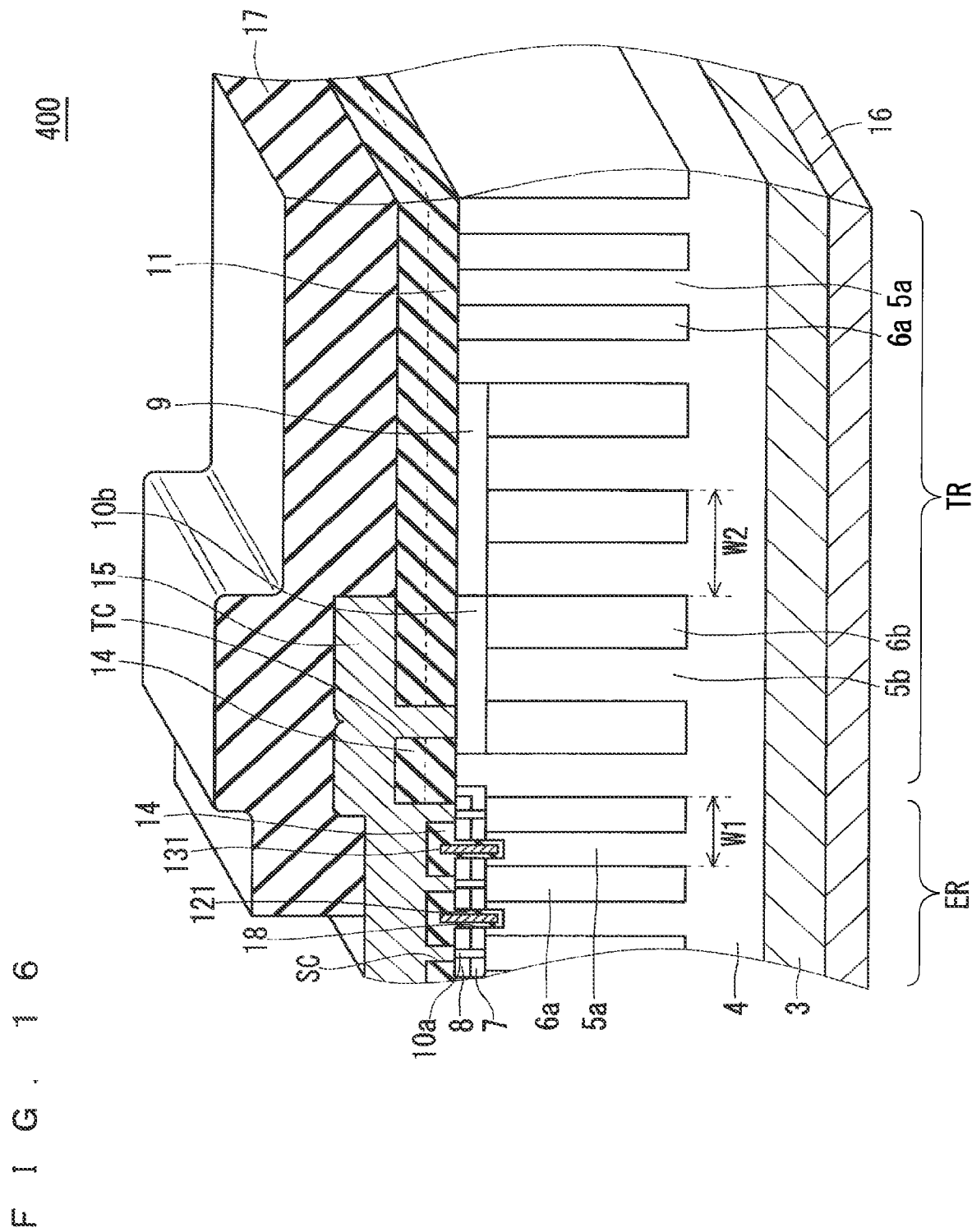
FIG. 16 is a perspective view illustrating a configuration of a semiconductor device according to a fourth embodiment of the present invention.

FIG. 16 is a perspective view illustrating a configuration of a vertical MOSFET 400 according to the fourth embodiment. Note that, in FIG. 16, the same reference symbols are given to the same components as those of the vertical MOSFET 100 described with reference to FIG. 3, and overlapping description is omitted.

As illustrated in FIG. 16, in the vertical MOSFET 400, a plurality of p-type well regions 7 are selectively provided in an upper layer portion of the epitaxial crystal growth layer 4, and a p-type contact region 10a is provided in each well region 7 to penetrate the well region 7. Further, in an upper layer portion of the well region 7, an n-type source region 8 is provided in contact with both side surfaces of the contact region 10a. Note that, the source region 8 is provided to cover the entire well region 7.

The source region 8 is provided such that the thickness thereof is smaller than the thickness of the well region 7, and the contact region 10a is provided such that the thickness thereof is roughly equal to or slightly larger than the thickness of the well region 7.

Further, a trench 18 is provided in the epitaxial crystal growth layer 4 between adjacent well regions 7 and source regions 8, and an inner surface of the trench 18 is covered by a gate insulating film 121. Further, the trench 18 is formed in contact with side surfaces of the well regions 7 and the source regions 8 to reach the inside of the epitaxial crystal growth layer 4, and the side surfaces of the well regions 7 and the source regions 8 come in contact with a surface of the gate insulating film 121.

Further, a gate electrode 131 is formed to fill the trench 18 whose inner surface is covered by the gate insulating film 121. The gate electrode 131 is formed to partially project from the inside of the trench 18. The interlayer insulating film 14 is formed to cover the gate electrode 131, the gate insulating film 121, and the source region 8. The source electrode 15 is formed to cover the interlayer insulating film 14.

In the vertical MOSFET 400 having the configuration described above, when a voltage is applied to the gate electrode 131, a channel is formed on a side surface of the well region 7 that extends along the side surface of the gate electrode 131. Through this channel, the source region 8 and the source electrode 15 are electrically connected via the well region 7, the n-type pillar layer 5a, the epitaxial crystal growth layer 4, and the semiconductor substrate 3.

<Manufacturing Method>

Next, a manufacturing process of the vertical MOSFET 400 is described with reference to FIG. 17 to FIG. 20. Note that, a process up to exposure of upper portions of the n-type pillar layers 5a and 5b and the p-type pillar layers 6a and 6b on a main surface of the epitaxial crystal growth layer 4 is the same as that of the first embodiment described with reference to FIG. 4 to FIG. 7, and therefore description thereof is omitted.

Figure 17:
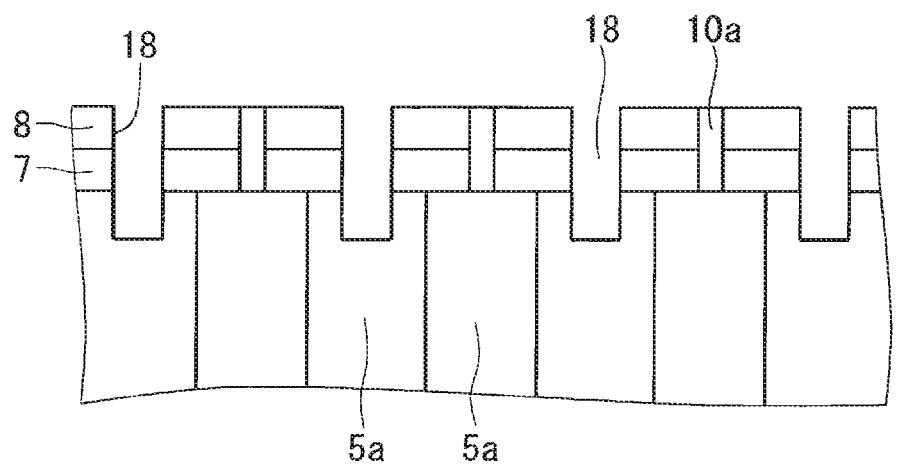
FIG. 17 is a view illustrating a manufacturing process of the semiconductor device according to the fourth embodiment of the present invention.

In a process illustrated in FIG. 17, impurity ions are implanted using a resist mask (not shown) that is patterned with photolithography, and the well region 7, the source region 8, and the contact region 10a and 10b are thereby selectively formed in an upper layer portion of the epitaxial crystal growth layer 4. Note that, the RESURF region 9 and contact region 10b are selectively formed in the termination region, but illustration thereof is omitted. Note that, a conductivity type, impurity concentration, depth, and implantation conditions of impurity in each region are the same as those in the first embodiment, and therefore description thereof is omitted.

After impurity is introduced, a heat treatment is performed for 0.5 to 60 minutes at a temperature of 1500 to 2200° C., for example, in an inert gas, such as argon or nitrogen, or in a vacuum, to thereby activate the implanted impurity. After that, an oxide film is formed on the epitaxial crystal growth layer 4 with sacrificial oxidation. Subsequently, an altered surface layer in the epitaxial crystal growth layer 4 is removed with oxide-film removal using hydrofluoric acid to obtain a clean surface. Then, the trench 18 penetrating the source region 8 and the well region 7 that are provided in an upper portion of a formation region of the n-type pillar layer 5a and reaching the inside of the epitaxial crystal growth layer 4 is formed. The trench 18 is desirably formed by dry etching, with which control of the shape is easy. Further, the width of the trench 18 is reduced to be smaller than the width of the n-type pillar layer 5a to avoid contact between a side surface of the trench 18 with the p-type pillar layer 6a, such that a channel is not formed in the p-type pillar layer 6a.

Figure 18:
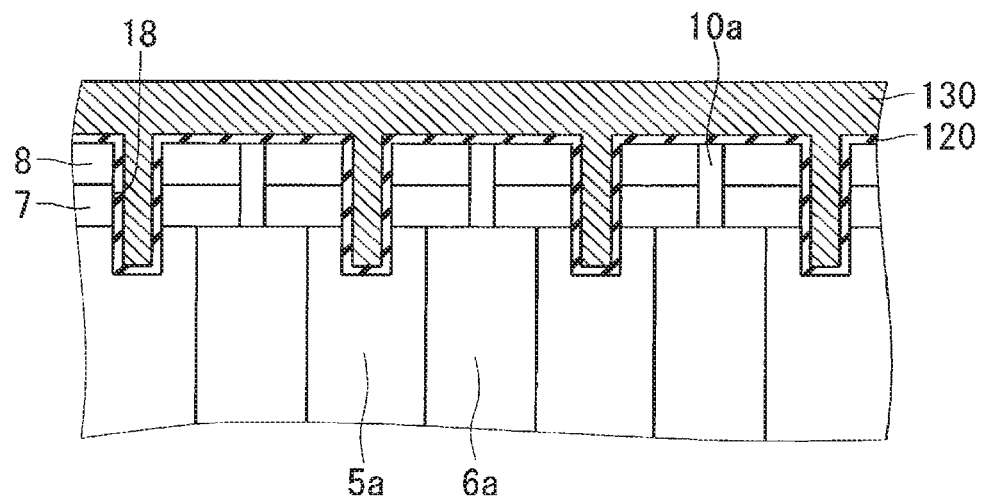
FIG. 18 is a view illustrating a manufacturing process of the semiconductor device according to the fourth embodiment of the present invention.

Next, in a process illustrated in FIG. 18, the insulating film 120 to form the gate insulating film 121 is formed to cover the inner surface of the trench 18. The insulating film 120 is formed on the entire substrate surface with thermal oxidation or CVD, for example.

Next, a conductive film 130 to form the gate electrode 131 is formed to fill the trench 18 whose inner surface is covered by the insulating film 120. The conductive film 130 is formed of polysilicon that contains impurity in high concentration, and is formed on the entire substrate surface with CVD.

Figure 19:
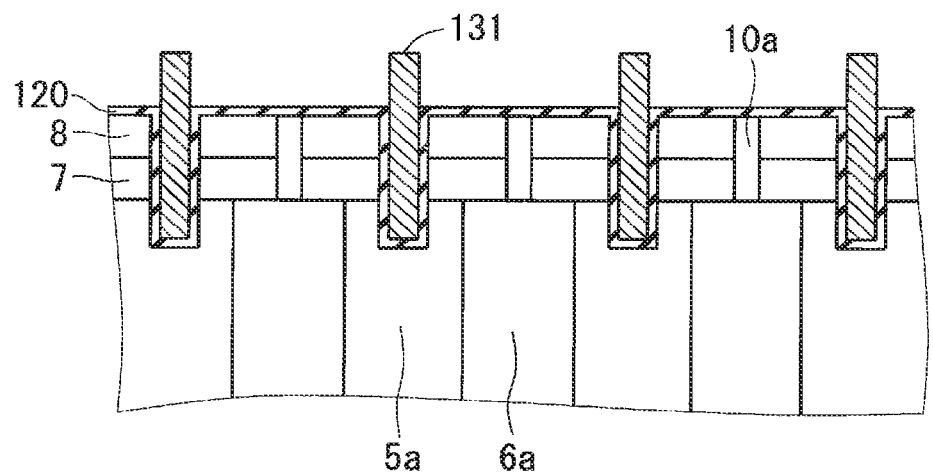
FIG. 19 is a view illustrating a manufacturing process of the semiconductor device according to the fourth embodiment of the present invention.

Next, an unnecessary part of the conductive film 130 is removed by dry etching. With this, as illustrated in FIG. 19, the gate electrode 131 that partially projects from the inside of the trench 18 is formed. When the gate electrode 131 partially projects from the inside of the trench 18 as described above, connection with gate wiring (not shown) can be facilitated.

Figure 20:
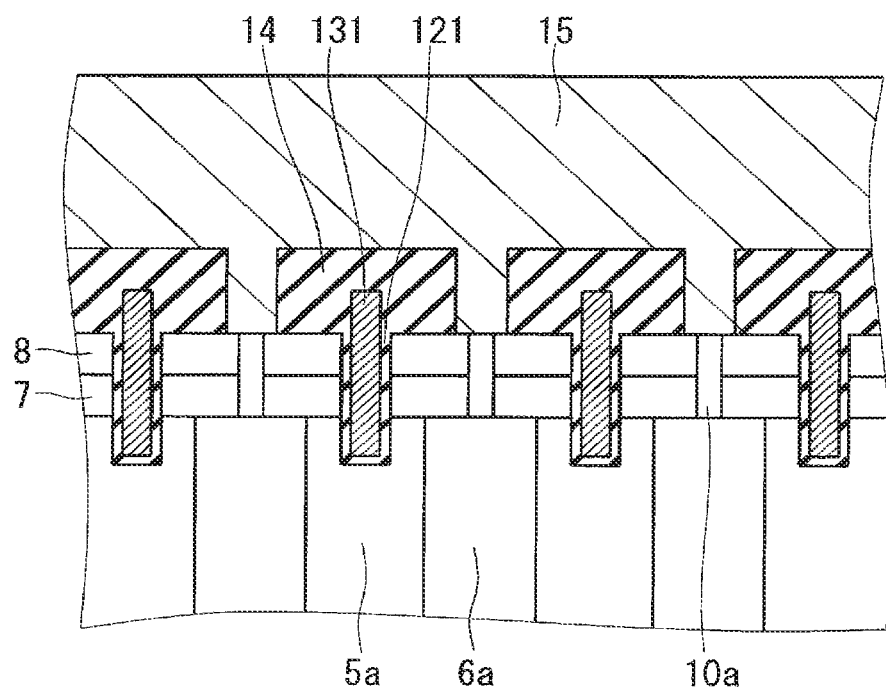
FIG. 20 is a view illustrating a manufacturing process of the semiconductor device according to the fourth embodiment of the present invention.

Next, the interlayer insulating film 14 is formed on the entire substrate surface with CVD, for example, to cover the gate electrode 131. After that, as illustrated in FIG. 20, the contact hole SC penetrating the interlayer insulating film 14 in the thickness direction and reaching a part of the source region 8 and the entire surface of the contact region 10a is formed. Note that, the contact hole TC penetrating the stacked film of the interlayer insulating film 14 and the field insulating film 11 in the thickness direction and reaching the contact region 10b is formed in the termination region TR, but illustration thereof is omitted. Note that, when the contact hole SC is formed, the insulating film 120 remaining on the epitaxial crystal growth layer 4 is also simultaneously removed.

After the contact holes SC and TC are provided in the interlayer insulating film 14, the source electrode 15 and gate wiring (not shown) are formed, and the drain electrode 16 is formed on the back surface of the semiconductor substrate 3. These material and forming method are described in the first embodiment, and therefore description thereof is omitted.

Finally, the passivation film 17 is provided to cover a partial upper portion of the source electrode 15 and an upper portion of the stacked film of the field insulating film 11 and the interlayer insulating film 14. With this, the vertical MOSFET 400 illustrated in FIG. 16 is completed.

As compared to the planar-channel MOSFET, the trench-channel MOSFET can reduce the width of the n-type pillar layer, and can achieve a MOSFET having a lower resistance.

Fifth Embodiment

In the vertical MOSFETs 100 to 400 described in the first to fourth embodiments, the pillar layers are formed with a so-called trench filling method, in which the pillar layers are formed by filling trenches provided in the epitaxial crystal growth layer 4 with a p-type semiconductor. Alternatively, the pillar layers may be formed with a multi-epitaxial method, in which implantation of p-type impurity ions and n-type epitaxial crystal growth are repeated a plurality of times.

Figure 21:
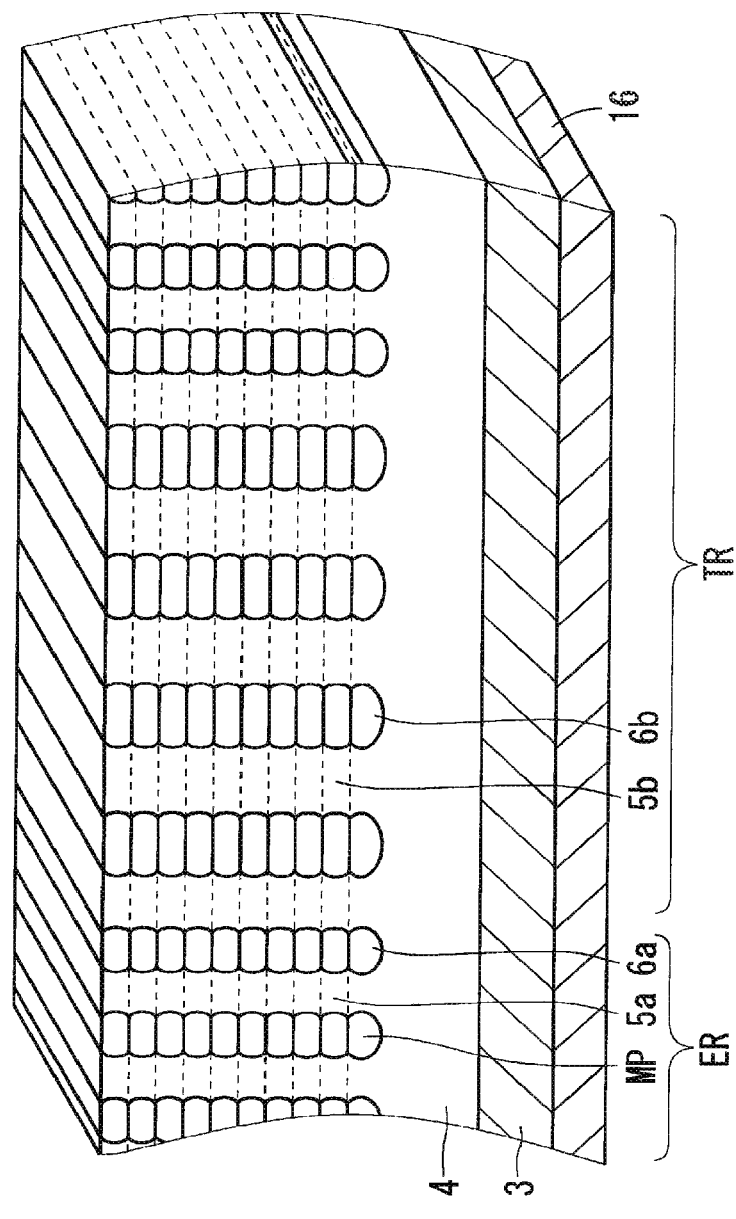
FIG. 21 is a perspective view illustrating a configuration of pillar layers formed with a multi-epitaxial method.

FIG. 21 is a perspective view illustrating a configuration of pillar layers formed with a multi-epitaxial method. The n-type pillar layers 5a and 5b and the p-type, pillar layers 6a and 6b illustrated in FIG. 21 are obtained by stacking a plurality of single pillar layers MP, each of which is formed by implantation of p-type impurity ions, in the thickness direction of the substrate.

Specifically, the n-type epitaxial crystal growth layer 4 is formed on the n-type semiconductor substrate 3 with a first epitaxial crystal growth, and then a single pillar layer MP is formed by implanting p-type impurity ions in a region to form a p-type pillar layer. The thickness of the epitaxial crystal growth layer 4 in this case is smaller than the thickness of the epitaxial crystal growth layer 4 used when the pillar layers are formed with the trench filling method.

In the ion implantation, a resist mask or an oxide-film mask formed with photolithography is used. Particularly, the use of a thick oxide-film mask enables high acceleration-energy ion implantation, and the thickness of each single pillar layer MP that can be formed by one ion implantation can be thereby increased. Therefore, the number of repetitions of ion implantation and epitaxial crystal growth can be decreased.

After the ion implantation, an oxide film is formed on the epitaxial crystal growth layer 4 with sacrificial oxidation. Subsequently, an altered surface layer in the epitaxial crystal growth layer 4 is removed with oxide-film removal using hydrofluoric acid to obtain a clean surface. Then, epitaxial crystal growth is conducted again, to thereby form, a second-layer epitaxial crystal growth layer 4. The thickness of the epitaxial crystal growth layer 4 in the second and succeeding layers is roughly equal to the thickness of the single pillar layer MP, and is set based on acceleration energy of the ion implantation, a material of the used mask, etc.

In this manner, the formation of the epitaxial crystal growth layers 4 and the formation of the single pillar layers MP are repeated such that a plurality of the single pillar layers MP are stacked. With this, the pillar layers having a thickness similar to that of the pillar layers formed with a trench filling method can be obtained.

Note that, the configuration in which the pillar pitch W1 of the n-type pillar layer 5a and the p-type pillar layer 6a in the element region ER and the pillar pitch W2 of the n-type pillar layer 5b and the p-type pillar layer 6b in the termination region TR are set such that a relationship of W1<W2 holds, and other configurations as well, are the same as in the first embodiment.

Figure 22:
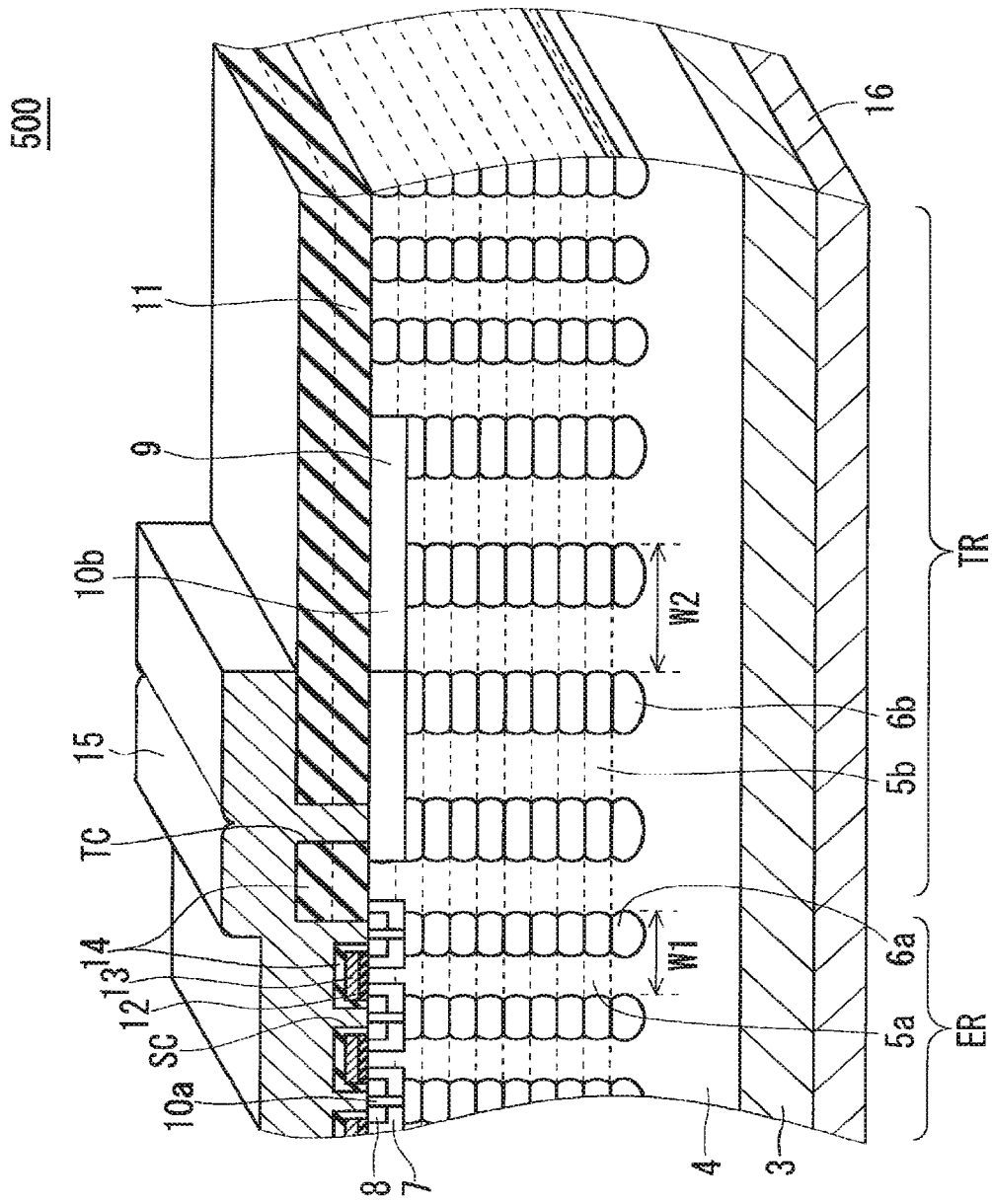
FIG. 22 is a perspective view illustrating a configuration of a semiconductor device according to a fifth embodiment of the present invention.

FIG. 22 is a perspective view of a vertical MOSFET 500 having pillar layers formed with a multi-epitaxial method. Note that, the configuration is the same as that of the vertical MOSFET 100 according to the first embodiment except that the p-type pillar layers 6a and 6b are formed by stacking single pillar layers MP. Note that, the passivation film 17 is not shown.

When the pillar layers are formed with the multi-epitaxial method, the width of the pillar layer can be reduced as compared to the trench filling method. This is because the width of the pillar layer is determined by dimension of a mask used during ion implantation, and thus the width of the pillar layer can be reduced to the limit of patterning of the mask. Further, in the multi-epitaxial method, the depth of the pillar layer can be determined based on the number of repetitions of epitaxial crystal growth and ion implantation. Therefore, in the multi-epitaxial method, the depth of the pillar layer can be increased to be larger, and a MOSFET having a higher breakdown voltage and lower resistance can be obtained, as compared to the trench filling method.

In the multi-epitaxial method, proper use of an implantation mask can provide difference in acceptor concentrations NA1 and NA2 of respective p-type pillar layers 6a and 6b that are formed by ion implantation. When the acceptor concentration NA2 of the p-type pillar layer 6b in the termination region TR is lower than the acceptor concentration NA1 of the p-type pillar layer 6a, and the width Wn2 of the n-type pillar layer 5b, the donor concentration ND thereof, and the width Wp2 of the p-type pillar layer in the termination region TR have a relationship of Wn2×ND=Wp2×NA2, extension of a depletion layer in the p-type pillar layer 6b in the termination region can further be increased.

Other Application Examples

The first to fifth embodiments described above illustrate an example where the present invention is applied to a MOSFET having the same conductivity type in the epitaxial crystal growth layer 4 and the semiconductor substrate 3. However, the present invention can also be applied to an insulated gate bipolar transistor (IGBT) having different conductivity types in the epitaxial crystal growth layer 4 and the semiconductor substrate 3.

For example, on the basis of the configuration illustrated in FIG. 3, the configuration of an IGBT is obtained by changing the semiconductor substrate 3 to have a p type while the epitaxial crystal growth layer 4 has an n type. In such a case, the source region 8 and the source electrode 15 of the MOSFET respectively correspond to an emitter region and an emitter electrode of the IGBT, and the drain electrode 16 of the MOSFET corresponds to a collector electrode.

Further, the present invention can also be applied to a free-standing substrate, which is formed only of the epitaxial crystal growth layer 4 obtained by removing the semiconductor substrate 3 in a mechanical, chemical, or other method. Note that, the free-standing substrate formed only of an epitaxial growth layer can also be referred to as a "semiconductor substrate." When a source region, a source electrode, etc. are formed on one main surface of a free-standing substrate, and a drain electrode is formed on another main surface, a MOSFET is obtained. When an emitter region, an emitter electrode, etc. are formed on one main surface of a free-standing substrate, and a collector region and a collector electrode are formed on another main surface, an IGBT is obtained.

While the invention has been shown and described in detail, the foregoing description is in all aspects illustrative and not restrictive. It is therefore understood that numerous unillustrated modifications can be devised without departing from the scope of the invention.

Note that, in the present invention, each of the embodiments may be freely combined, and each of the embodiments may be modified or omitted as appropriate within the scope of the invention.

The invention claimed is:

1. A semiconductor device comprising:
   a semiconductor substrate;
   a semiconductor layer of a first conductivity type that is disposed on the semiconductor substrate;
   a first impurity region of a second conductivity type that is selectively disposed on an upper layer portion of the semiconductor layer in an active region;
   a second impurity region of the first conductivity type that is selectively disposed on an upper layer portion of the first impurity region;
   a first main electrode connected to the second impurity region;
   a gate insulating film disposed to be continuously in contact with the second impurity region, the first impurity region, and the semiconductor layer;
   a gate electrode disposed to be opposed to the second impurity region, the first impurity region, and the semiconductor layer across the gate insulating film; and
   a second main electrode disposed on an opposite side to the semiconductor layer of the semiconductor substrate, wherein
   the semiconductor layer comprises first pillar layers of the first conductivity type and second pillar layers of the second conductivity type, the first pillar layers and the second pillar layers being provided to extend from a main surface located on an opposite side to the semiconductor substrate toward the semiconductor substrate by a predetermined depth,
   the first pillar layers and the second pillar layers are alternately provided in a direction in parallel with the main surface in the active region of the semiconductor layer and in a termination region that is a region around the active region,
   the first impurity region is provided in an upper layer portion of the second pillar layers,
   the semiconductor layer to which the gate insulating film comes in contact is the first pillar layers,
   a pillar pitch defined by a total width of a pair of one of the first pillar layers and one of the second pillar layers in the termination region is set to be larger than a pillar pitch defined by a total width of a pair of one of the first pillar layers and one of the second pillar layers in the active region, and
   a product of a width of one of the first pillar layers and effective impurity concentration of the first conductivity of the one of the first pillar layers is equal to a product of a width of one of the second pillar layers and effective impurity concentration of the second conductivity of the one of the second pillar layers in each of the active region and the termination region.

2. The semiconductor device according to claim 1, wherein
   impurity concentration of the first pillar layers in the active region and impurity concentration of the first pillar layers in the termination region are set to be equal, and
   impurity concentration of the second pillar layers in the active region and impurity concentration of the second pillar layers in the termination region are set to be equal.

3. The semiconductor device according to claim 1, wherein the first pillar layers and the second pillar layers are provided by forming the second pillar layers at intervals in the semiconductor layer, below the first pillar layers and the second pillar layers, the semiconductor layer is present as a buffer layer, and a sum of a product of a width of one of the first pillar layers, a depth of the one of the first pillar layers, and effective impurity concentration of the first conductivity of the one of the first pillar layers and a product of one pillar pitch, a thickness of the buffer layer, and impurity concentration of the first conductivity of the buffer layer is equal to a product of a width of one of the second pillar layers, a depth of the one of the second pillar layers, and effective impurity concentration of the second conductivity of the one of the second pillar layers.

4. The semiconductor device according to claim 1, wherein the semiconductor layer further comprises a RESURF region of the second conductivity type that is provided to extend over upper layer portions of the first pillar layers and the second pillar layers in the termination region, the RESURF region is electrically connected to the first main electrode, and the second pillar layers in the termination region are electrically connected to the first main electrode via the RESURF region.

5. The semiconductor device according to claim 4, wherein the RESURF region is provided to extend up to an outermost periphery of the termination region, and the first pillar layers and the second pillar layers are absent below the RESURF region on the outermost periphery of the termination region.

6. The semiconductor device according to claim 1, wherein the first pillar layers and the second pillar layers in the termination region are set such that the pillar pitches of the first pillar layers and the second pillar layers have the same value in the entire termination region.

7. The semiconductor device according to claim 1, wherein the first pillar layers and the second pillar layers in the termination region are set such that a pillar pitch defined by a total width of a pair of one of the first pillar layers and one of the second pillar layers that are provide in a region close to the active region and a pillar pitch of another of the first pillar layers and another of the second pillar layers have different values.

8. The semiconductor device according to claim 1, wherein the semiconductor substrate uses silicon carbide as a semiconductor.

* * * * *